United States Patent
Tan et al.

(10) Patent No.: US 8,627,189 B2
(45) Date of Patent: Jan. 7, 2014

(54) HIGH PERFORMANCE DIGITAL SIGNAL PROCESSING IN SOFTWARE RADIOS

(75) Inventors: Kun Tan, Beijing (CN); Jiansong Zhang, Beijing (CN); Yongguang Zhang, Beijing (CN); He Liu, Beijing (CN)

(73) Assignee: Microsoft Corporation, Redmond, WA (US)

( * ) Notice: Subject to any disclaimer, the term of this patent is extended or adjusted under 35 U.S.C. 154(b) by 535 days.

(21) Appl. No.: 12/630,774

(22) Filed: Dec. 3, 2009

(65) Prior Publication Data
US 2011/0138259 A1 Jun. 9, 2011

(51) Int. Cl.
*G06F 11/00* (2006.01)

(52) U.S. Cl.
USPC .......................................... 714/795; 714/792

(58) Field of Classification Search
None
See application file for complete search history.

(56) References Cited

U.S. PATENT DOCUMENTS

| | | | |
|---|---|---|---|
| 5,099,417 A | 3/1992 | Magar et al. | |
| 5,212,777 A | 5/1993 | Gove et al. | |
| 5,708,593 A | 1/1998 | Saby et al. | |
| 5,784,640 A | 7/1998 | Asghar et al. | |
| 5,930,298 A | 7/1999 | Choi | |
| 6,114,971 A | 9/2000 | Nysen | |
| 6,167,031 A | 12/2000 | Olofsson et al. | |
| 6,182,030 B1 | 1/2001 | Hagen et al. | |
| 6,188,702 B1 | 2/2001 | Tornetta et al. | |
| 6,298,370 B1 | 10/2001 | Tang et al. | |
| 6,351,499 B1 | 2/2002 | Paulraj et al. | |
| 6,415,415 B1 | 7/2002 | Karabed | |
| 6,557,062 B1 | 4/2003 | Shaler et al. | |
| 6,578,153 B1 | 6/2003 | Sankey et al. | |
| 6,587,671 B1 | 7/2003 | Kanago et al. | |
| 6,654,428 B1 | 11/2003 | Bose et al. | |
| 6,665,311 B2 | 12/2003 | Kondylis et al. | |
| 6,735,448 B1 | 5/2004 | Krishnamurthy et al. | |
| 6,748,034 B2 | 6/2004 | Hattori et al. | |
| 6,788,702 B1 | 9/2004 | Garcia-Luna-Aceves et al. | |
| 6,825,827 B2 | 11/2004 | Miura | |
| 6,864,715 B1 | 3/2005 | Bauer et al. | |
| 6,963,579 B2 | 11/2005 | Suri | |
| 7,072,818 B1 | 7/2006 | Beardslee et al. | |
| 7,142,617 B2 | 11/2006 | Mohan | |
| 7,162,204 B2 | 1/2007 | Hansen et al. | |

(Continued)

FOREIGN PATENT DOCUMENTS

WO WO9901945 1/1999
WO WO2006083495 A2 8/2006

OTHER PUBLICATIONS

Advanced Concept Engineering Corp., "Ultra High-Performance Viterbi Decoder Core ACIP Viterbi_K7—", retrived at <<http://www.acengr.com/datasheet/ACIP_Viterbi_DataSheet.pdf>> on Aug. 11, 2009.

(Continued)

*Primary Examiner* — Christopher McCarthy
(74) *Attorney, Agent, or Firm* — Lee & Hayes, PLLC

(57) ABSTRACT

An extensive use of look-up table (LUT) and single instruction multiple data (SIMD) in different algorithms in a software-defined radio (SDR) system is described. In particular, the LUT is used during spreading modulation, mapping and spreading, scrambling, de-scrambling, soft demapping, and the like. The SIMD is executed by a multi-core processor during implementation of a "min" operation to find an optimal path in a Trellis diagram for a Viterbi decoder.

20 Claims, 25 Drawing Sheets

(56) References Cited

U.S. PATENT DOCUMENTS

| | | | |
|---|---|---|---|
| 7,174,145 B2 | 2/2007 | Chatelier et al. | |
| 7,230,978 B2 | 6/2007 | Bitterlich et al. | |
| 7,404,074 B2 | 7/2008 | Murotake | |
| 7,444,168 B2 | 10/2008 | Nakagawa et al. | |
| 7,565,140 B2 | 7/2009 | Levy et al. | |
| 7,610,017 B2 | 10/2009 | Girardeau, Jr. et al. | |
| 7,738,913 B2 | 6/2010 | Hilpisch et al. | |
| 7,774,017 B2 | 8/2010 | Irita et al. | |
| 7,894,556 B2 | 2/2011 | Casabona et al. | |
| 2002/0126704 A1 | 9/2002 | Cam et al. | |
| 2002/0155811 A1 | 10/2002 | Prismantas et al. | |
| 2004/0068730 A1 | 4/2004 | Miller et al. | |
| 2004/0153957 A1* | 8/2004 | Feldman et al. | 714/795 |
| 2004/0156449 A1 | 8/2004 | Bose et al. | |
| 2004/0252684 A1 | 12/2004 | Evans et al. | |
| 2005/0124330 A1 | 6/2005 | Hong et al. | |
| 2005/0202848 A1 | 9/2005 | Chang | |
| 2006/0015674 A1 | 1/2006 | Murotake | |
| 2006/0115012 A1 | 6/2006 | Sadowsky et al. | |
| 2006/0145897 A1 | 7/2006 | Kadono et al. | |
| 2006/0168587 A1 | 7/2006 | Aslam-Mir | |
| 2006/0190904 A1 | 8/2006 | Haji-Aghajani et al. | |
| 2006/0212624 A1 | 9/2006 | Kim | |
| 2006/0227856 A1 | 10/2006 | Ledvina et al. | |
| 2007/0076649 A1 | 4/2007 | Lin et al. | |
| 2007/0083786 A1 | 4/2007 | Chiang | |
| 2007/0092018 A1* | 4/2007 | Fonseka et al. | 375/265 |
| 2007/0155429 A1 | 7/2007 | Levy et al. | |
| 2007/0178841 A1 | 8/2007 | Oliynyk et al. | |
| 2007/0247139 A1 | 10/2007 | Veroni et al. | |
| 2008/0003949 A1 | 1/2008 | Voonna et al. | |
| 2008/0043668 A1 | 2/2008 | Chen et al. | |
| 2008/0095100 A1 | 4/2008 | Cleveland et al. | |
| 2008/0095135 A1 | 4/2008 | Cleveland | |
| 2008/0098133 A1 | 4/2008 | Shaanan et al. | |
| 2008/0130519 A1 | 6/2008 | Bahl et al. | |
| 2008/0165754 A1 | 7/2008 | Hu | |
| 2008/0175421 A1 | 7/2008 | Chizari | |
| 2008/0178062 A1* | 7/2008 | Norris et al. | 714/786 |
| 2008/0232487 A1 | 9/2008 | Cleveland et al. | |
| 2008/0261639 A1 | 10/2008 | Sun et al. | |
| 2008/0261650 A1 | 10/2008 | Piriyapoksombut et al. | |
| 2008/0300006 A1 | 12/2008 | Rofougaran et al. | |
| 2008/0320529 A1 | 12/2008 | Louchkoff et al. | |
| 2009/0034457 A1 | 2/2009 | Bahl et al. | |
| 2009/0061783 A1 | 3/2009 | Choi et al. | |
| 2009/0063057 A1 | 3/2009 | Miettinen | |
| 2009/0088104 A1 | 4/2009 | Cheng et al. | |
| 2009/0089556 A1* | 4/2009 | Lee et al. | 712/223 |
| 2009/0110033 A1* | 4/2009 | Shattil | 375/141 |
| 2009/0119570 A1 | 5/2009 | Eder et al. | |
| 2009/0156129 A1 | 6/2009 | Hassan et al. | |
| 2009/0160486 A1 | 6/2009 | Lee | |
| 2009/0175381 A1* | 7/2009 | Bougard | 375/316 |
| 2009/0196180 A1 | 8/2009 | Bahl et al. | |
| 2009/0197627 A1 | 8/2009 | Kuffner et al. | |
| 2009/0204725 A1 | 8/2009 | Liu et al. | |
| 2009/0235316 A1 | 9/2009 | Wu et al. | |
| 2009/0253376 A1 | 10/2009 | Parssinen et al. | |
| 2009/0258603 A1 | 10/2009 | Ghaboosi et al. | |
| 2009/0298522 A1 | 12/2009 | Chaudhri et al. | |
| 2009/0323600 A1 | 12/2009 | Chandra et al. | |
| 2010/0031098 A1 | 2/2010 | Kobayashi | |
| 2010/0048234 A1 | 2/2010 | Singh | |
| 2010/0075704 A1 | 3/2010 | McHenry et al. | |
| 2010/0159855 A1 | 6/2010 | Hardacker et al. | |
| 2010/0232369 A1* | 9/2010 | Jing et al. | 370/329 |
| 2010/0246506 A1 | 9/2010 | Krishnaswamy | |
| 2010/0260137 A1 | 10/2010 | Vrzic et al. | |
| 2010/0301992 A1 | 12/2010 | Chandra et al. | |
| 2010/0309806 A1 | 12/2010 | Wu et al. | |
| 2011/0096658 A1 | 4/2011 | Yang et al. | |

OTHER PUBLICATIONS

Arslan, "Teaching SDR through a Laboratory Based Course with Modern Measurement and Test Instruments", published Nov. 5-9, 2007, retrieved from the Internet at <<http://www.sdrforum.org/pages/sdr07/Proceedings/Papers/1.2/1.2-3.pdf.

Bougard, et al., "A Coarse-Grained Array Accelerator for Software-Defined Radio Baseband Processing", retrieved on Jun. 19, 2009 at <<http://ieeexplore.ieee.org/stamp/stamp.jsp?tp=&arnumber=4626817&isnumber=4626808, IEEE Micro, Jul.-Aug. 2008, pp. 41-50.

Boyd-Wickizer, et al., "Corey: an operating system for many cores", retrieved on Jun. 19, 2009 at <<http://www.mit.edu/~y_z/papers/corey-osdi08.pdf>>, pp. 1-14.

Burton, "16-Channel, DDS LVDS Interface with Per-Channel Alignment", retrieved on Aug. 13, 2009 at <<http://www.xilinx.com/support/documentation/application_notes/xapp855.pdf>>, Xilinx, Application Note: Virtex-5 FPGAs, XAPP855, Oct. 13, 2006, pp. 1-43.

Cummings, et al., "FPGA in the Software Radio", retrieved on Jun. 19, 2009 at <<http://ieeexplore.ieee.org/stamp/stamp.jsp?tp=&arnumber=747258, IEEE Communications Magazine, Feb. 2009, pp. 108-112.

Dong et al., "Neural Networks Based Parallel Viterbi Decoder by Hybrid Design", Proceeding of the 5th World Congress on Intelligent Control and Automation, Jun. 15-19, 2004, pp. #1923-pp. #1926.

"GAO USB PC Based Oscilloscope (1Mega) Model A0130005", retrieved on Aug. 13, 2009 at <<http://www.gaoinstruments.com/gao2902_usb_pc_based_oscilloscope_1mega-p-53.html.

Glossner, et al., "A Software-Defined Communications Baseband Design", retrieved on Jun. 19, 2009 at <<http://ieeexplore.ieee.org/stamp/stamp.jsp?tp=&arnumber=1166669&isnumber=26307>>, IEEE Communications Magazine, Jan. 2003, pp. 120-128.

Glossner, et al., "The Sandbridge Sandblaster Communications Processor", 3rd Workshop on Application Specific Processors, 2004.

"GNU Radio", retrieved on Jun. 19, 2009 at <<http://www.gnu.org/software/gnuradio/>>, 2 pages.

Goldsmith, "Wireless Communications", retrieved on Jun. 19, 2009 at <<http://assets.cambridge.org/97805218/37163/copyright/9780521837163_copyright.pdf>>, Cambridge University Press, 2 pages.

"Host AP driver for Intersil Prism2/2.5/3, hostapd, and WPA Supplicant", retrieved on Jun. 19, 2009 at <<http://hostap.epitest.fi/>>, Mar. 23, 2009, 4 pages.

Jamieson, et al., "PPR: Partial Packet Recovery for Wireless Networks", retrieved on Jun. 19, 2009 at <<http://nms.lcs.mit.edu/papers/fp315-jamieson.pdf>>, SIGCOMM 2007, ACM 2007, 12 pages.

Katti, et al., "Embracing Wireless Interference: Analog Network Coding", retrieved on Jun. 19, 2009 at <<http://nms.lcs.mit.edu/~dina/pub/anc.pdf>>, SIGCOMM 2007, ACM 2007, 12 pages.

Kim et al., "Low Power, High-Rate Viterbi Decoder Employing the SST (Scarce State Transition) Scheme and Radix-4 Trellis" Department of Electrical and Computer Engineering, Sungkyunkwan University, pp. #1-pp. #4, 2000.

Kim et al., "Power Efficient Viterbi Decoder based on Pre-computation Technique for Portable Digital Multimedia Broadcasting Receiver", IEEE Transactions on Consumer Electronics, vol. 53, No. 2, May 2007, pp. #350-pp. #356.

Lin, et al., "IBM Research Report Wireless Base Station Design on General Purpose Processor with Multicore Technology", retrieved on Aug. 13, 2009 at <<http://domino.watson.ibm.com/library/cyberdig.nsf/papers/B4C36233C8280F27852575FD005991DF/$File/rc24823.pdf>>, IBM Research Division, China Research Laboratory, Electrical Engineering, RC24823, Jul. 14, 2009, 9 pages.

Lin, et al., "SODA: A Low-power Architecture for Software Radio", retrieved on Jun. 19, 2009 at <<http://ieeexplore.ieee.org/stamp/stamp.jsp?tp=&arnumber=1635943>>, Proceedings of the 33rd International Symposium on Computer Architecture (ISCA 2006), IEEE, 2006.

(56) References Cited

OTHER PUBLICATIONS

Lin, et al., "Software Defined Radio—A High Performance Challenge", retrieved on Jun. 19, 2009 at <<http://citeseerx.ist.psu.edu/viewdoc/download?doi=10.1.1.92.7327&rep=rep1&type=pdf>>, SDRG, pp. 1-41.

"LVDS-Based SerDes for Video Interconnects", retrieved on Aug. 13, 2009 at <<http://www.epn-online.com/page/new51279>>, EPN, Electronic Product News, pp. 1-11.

Madwifi, retrieved on Jun. 19, 2009 at <<http://sourceforge.net/projects/madwifi>>, 1 page.

Minden, et al., "KUAR: A Flexible Software-Defined Radio Development Platform", retrieved on Jun. 19, 2009 at <<http://www.ittc.ku.edu/publications/documents/minden2007_dyspan07.pdf>>, 12 pages.

Neel, et al., "A Formal Methodology for Estimating the Feasible Processor Solution Space for a Software Radio", retrieved on Jun. 19, 2009 at <<http://www.sdrforum.org/pages/sdr05/1.2%20Reconfigurable%20Hardware/1.2-03% 20Neel%20et%20al.pdf>>, Proceeding of the SDR 2005 Technical Conference and Product Exposition, SDR, 2005, 6 pages.

Neufeld, et al., "SoftMAC—Flexible Wireless Research Platform", retrieved on Jun. 19, 2009 at <<http://conferences.sigcomm.org/hotnets/2005/papers/grunwald.pdf>>, Department of Computer Science, University of Colorado, Boulder, Nov. 4, 2005, pp. 1-6.

"Part 11: Wireless LAN Medium Access Control (MAC) and Physical Layer (PHY) Specifications", retrieved on Jun. 19, 2009 at <<http://www.csse.uwa.edu.au/adhocnets/802.11-1999.pdf>>, ANSI/IEEE Std 802.11, 1999 Edition, pp. i-xiv and 1-512.

"Rt2x00", retrieved on Jun. 19, 2009 at <<http://rt2x00.serialmonkey.com>>, Apr. 12, 2009, 3 pages.

Savvopoulos, et al., "A Software-Radio Test-bed for Measuring the Performance of DVB-S2 Receiver Circuits", published Oct. 6-8, 2008.

Sawyer, "High-Speed Data Serialization and Deserialization (840 Mb/s LVDS)", retrieved on Aug. 13, 2009 at <<http://www.eetindia.co.in/ARTICLES/2002JUN/2002JUN28_AMD_NTEK_AN.PDF?SOURCES=DOWNLOAD>>, Xilinx, Application Note: Virtex-II Family, XAPP265, Jun. 19, 2002, pp. 1-13.

Schmid, et al., "An Experimental Study of Network Performance Impact of Increased Latency in Software Defined Radios", retrieved on Jun. 19, 2009 at <<http://nesl.ee.ucla.edu/fw/thomas/wintech401-schmid.pdf>>,WiNTEC 2007, Networked and Embedded Systems Laboratory, Electrical Engineering Department, University of California, Los Angeles, 8 pages.

Siu et al., "A Robust Viterbi Algorithm against Impulsive Noise with Application to Speech Recognition", IEEE Transactions on Audio, Speech, and Language Processing, vol. 14, No. 6, Nov. 2006, pp. #2122-pp. #2133.

"Small Form Factor SDR Development Platform", retrieved on Jun. 19, 2009 at <<http://www.kanecomputing.co.uk/lyrtech_sff_sdr_dev_platform.htm>>, Kane Computing Ltd., 2 pages.

"Software-Defined Radio System", retrieved on Jun. 19, 2009 at <<http://zone.ni.com/devzone/cda/tut/p/id/8787>>, National Instruments, May 26, 2009, pp. 1-5.

Tan, et al., "Sora: High Performance Software Radio Using General Purpose Multi-Core Processors", retrieved on Aug. 13, 2009 at <<http://www.usenix.org/event/nsdi09/tech/slides/tan.pdf>>, NSDI, 2009, pp. 1-27.

Tennenhouse, et al., "SpectrumWare—A Software-Oriented Approach to Wireless Signal Processing", retrieved on Jun. 19, 2009 at <<http://citeseerx.ist.psu.edu/viewdoc/download;jsessionid=D99E57C2A2A3CEEF89F66CBA544F774F?doi=10.1.1.17.9618&rep=rep1&type=pdf>>, Telemedia Networks and Systems Group Laboratory for Computer Science, MIT, pp. 1-15.

"The Kill Rule for Multicore", retrieved on Jun. 19, 2009 at <<http://ieeexplore.ieee.org/stamp/stamp.jsp?arnumber=04261283>>, DAC 2007, ACM 2007, pp. 750-753.

"Think Beyond the Box—A Software-Defined Approach to RF Test", Published May 13, 2009, retrieved from the internet at <<http://zone.ni.com/devzone/cda/pub/p/id/750>>.

Tsou, et al., "Latency Profiling for SCA Software Radio", retrieved on Jun. 19, 2009 at <<http://www.sdrforum.org/pages/sdr07/Proceedings/Papers/2.2/2.2-1.pdf>>, SDR Forum Technical Conference 2007, 6 pages.

"Using Flexible-LVDS I/O Pins in APEX II Devices", retrieved on Aug. 13, 2009 at <<http://www.altera.com/literature/an/an167.pdf>>, Altera Corporation, Application Note 167, ver 1.1, Aug. 2002, pp. 1-14.

Verdu, "Multiuser Detection", retrieved on Jun. 19, 2009 at <<http://www.cambridge.org/US/catalogue/catalogue.asp?isbn=0521593735>>, Aug. 1998, 2 pages.

"WARP: Wireless Open Access Research Platform", retrieved on Jun. 19, 2009 at <<http://warp.rice.edu/trac>>, Rice University, 2 pages.

"Waveform Creator has Object-Oriented GUI Optimized for MIMO", Published Jun. 30, 2008, retrieved from the internet at <<http://news.thomasnet.com/fullstory/545867>>.

Wu, et al., "A Novel Software Radio Platform Based on General PC and Network", 2006 IEEE, Published 2006, retrieved from the internet at <<http://ieeexplore.ieee.org/stamp/stamp.jsp?arnumber=04149565>>.

Bahl et al, "White Space Networking with Wi-FI like Connectivity," SIGCOMM '09, Barcelona, Spain, Aug. 17-21, 2009, 12 pgs.

Chandra et al, "A Case for Adapting Channel Width in Wireless Networks," In Proceedings of the ACM SIGCOMM '08 Conference on Data Communication, Aug. 17-22, 2008, Seattle, Washington, 12 pgs.

Dutta et al, "An Intelligent Physical Layer for Cognitive Radio Networks," Proceedings of the 4th Annual International Conference on Wireless Internet, WICON '08, Nov. 17-19, 2008, 9 pgs.

"WBX," Ettus Research LLC, retreived from <<http://www.ettus.com/WBX>> on Apr. 25, 2011, 1 pg.

"Welcome to Ettus Research," Ettus Research LLC, retrieved from <<http://www.ettus.com>> on Apr. 25, 2011, 2 pgs.

Gockler et al, "Parallelisation of Digital Signal Processing in Uniform and Reconfigurable Filter Banks for Satellite Communications," IEEE Asia Pacific Conference on Circuits and Systems, APCCAS 2006, Dec. 4-7, 2006, 4 pgs.

Li et al, "A Frequency Hopping Spread Spectrum Transmission Scheme for Uncoordinated Cognitive Radios," IEEE International Conference on Acoustics, Speech and Signal Processing, ICASSP 2009, Taipei, Apr. 19-24, 2009, pp. 2345-2348.

Microsoft Research, "WhiteFiService Home," retrieved from <<http://whitespaces.msresearch.us>> on Apr. 25, 2011, 2 pgs.

Mody et al, "Machine Learning Based Cognitive Communications in White as Well as the Gray Space," IEEE, Oct. 2007, pp. 1-7.

Narlanka et al, "A Hardware Platform for Utilizing TV Bands With a Wi-Fi Radio," 15th IEEE Workshop on Local & Metropolitan Area Networks, Lanman 2007, New York, NY, Jun. 10-13, 2007, 5 pgs.

Office Action for U.S. Appl. No. 12/631,548, mailed on Jan. 10, 2012, Kun Tan, "Analyzing Wireless Technologies Based on Software-Defined Radio", 8 pgs.

Park et al, "Frequency-Domain Channel Estimation and Equalization for Continuous-Phase Modulations With Superimposed Pilot Sequences," IEEE Transactions on Vehicular Technology, vol. 58, No. 9, Nov. 2009, pp. 4903-4908.

"Radio Technology from Full Spectrum used in White Space," Radio Electronics.com, retrieved from <<http://www.radio-electronics.com/news/radio-receivers/radio-technology-from-full-spectrum-used-48>>, Sep. 22, 2010, 2 pgs.

Rahul et al, "Learning to Share: Narrowband-Friendly Wideband Networks," In Proceedings of the ACM SIGCOMM '08 Conference on Data Communication, Aug. 17-22, 2008, Seattle, Washington, 12 pgs.

Smirnov et al, "The Use of Spectral Analysis in Identifying Applications Runny on Enterprise Data Center Systems," CMG Computer Measurement Group, retrieved from <<http://www.cmg.org/measureit/issues/mit62/m_62_11.html>>, Aug. 2009, 6 pgs.

"Software Radio," Microsoft Research, retrieved from <<http://research.microsoft.com/sora>> on Apr. 25, 2011, 3 pgs.

(56) References Cited

OTHER PUBLICATIONS

Suzuki et al, "Proposal of Band-Limited Divided-Spectrum Single Carrier Transmission for Dynamic Spectrum Controlled Access in ISM Band," Personal, Indoor and Mobile Radio Communications, 2009 IEEE 20th International Symposium, Sep. 3-16, 2009, pp. 132-136.
Wang et al, "List-Coloring Based Channel Allocation for Open-Spectrum Wireless Networks," IEEE, Sep. 2005, pp. 690-694.
Yang et al, "Supporting Demanding Wireless Applications with Frequency-agile Radios," Proceedings of 7th USENIX Symposium on Networked Systems Design and Implementation (NSDI 2010), San Jose, California, Apr. 2010, pp. 1-15.
Zaki et al, "LTE Wireless Virtualization and Spectrum Management," 2010 Third Joint IFIP, Wireless and Mobile Networking Conference (WMNC), Budapest, Oct. 13-15, 2010, 6 pgs.
PCT Intl Search Report (PCT/US2010/049013) dtd May 13, 2011.
Office Action for U.S. Appl. No. 12/535,415, mailed on Apr. 11, 2012, Kun Tan, "Software-Defined Radio Using Multi-Core Processor", 15 pgs.
"8b/10b encoding", Wikipedia, accessed on Apr. 21, 2011 <http://en.wikipedia.org/wiki/8b/10B>, 9 pages.
"Ethernet Frame", Wikipedia, accessed on Apr. 21, 2011, <http://en.wikipedia.org/wiki/Ethernet_frame>, 6 pages.
"Low-Voltage Differential Signaling", Wikipedia, accessed on Apr. 21, 2011 <http://en.wikipedia.org/wiki/Low-voltage_differential_signaling>, 7 pages.
Ma, "A Closer Look at LVDS Technology", Pericom, Application Note 41, Nov. 16, 2001. 3 pages.
Office action for U.S. Appl. No. 12/571,188, mailed on Jun. 6, 2012, Tan et al., "Radio Control Board for Software-Defined Radio Platform", 18 pages.
Office action for U.S. Appl. No. 12/631,548, mailed on Jul. 2, 2012, Tan et al., "Analyzing Wireless Technologies Based on Software-Defined Radio", 7 pages.
System Packet Interface Level 4 (SPI-4) Phase 2 Revision 1: OC-192 System Interface for Physical and Link Layer Devices, Optical Internetworkig Forum, Oct. 15, 2003, 72 pages.
Office action for U.S. Appl. No. 12/535,415, mailed on Apr. 8, 2013, Tan et al., "Software-Defined Radio Using Multi-Core Processor", 26 pages.
Alocci et al., "Development of an IEEE 802.11s Simulation Model for QualNet", Dublin, Ireland, retrieved at http://www.csi.ucd.ie/Staff/jmurphy/publications/1551.pdf, Sep. 2008, 9 pages.
"Authorized Ex Parte Contact—Unlicensed Operation in the TV Broadcast Bands (ET Docket No. 04-186), FCC.", Retrieved at << http://hraunfoss.fcc.gov/edocs_public/attachmatch /DA-04-4013A1.pdf >>, Dec. 22, 2004, Pages 2.
Bhatt, "Creating a PCI Express Interconnect", Intel Corporation, 2002, 8 pages.
Borth et al., "Considerations for Successful Cognitive Radio Systems in US TV White Space", Proceedings of the 3rd IEEE Symposium on New Frontiers in Dynamic Spectrum Access Networks, Oct. 14-17, 2008, retrieved at <<http://ieeexplore.ieee.org/stamp/stamp.jsp?tp=& isnumber=&arnumber=4658272, 5 pages.
Broch et al., "A Performance Comparison of Multi-Hop Wireless Ad Hoc Network Routing Protocols", International Conference on Mobile Computing and Networking, Proceedings of the 4th annual ACM/IEEE international conference on Mobile computing and Networking, Oct. 25-30, 1998, pp. 85-97.
Broch, et al., "A Performance Comparison of Multi-Hop Wireless Ad Hoc Network Routing Protocols", Retrieved at << http://delivery.acm.org/10.1145/290000/ 288256/p85-broch.pdf?key1=288256&key2=2437561621&coll=GUIDE&dl=GUIDE&CFID=68071891& CFTOKEN=72132090 >>, International Conference on Mobile Computing and Networking, Proceedings of the 4th annual ACM/IEEE international conference on Mobile computing and networking, Oct. 25-30, 1998, pp. 85-97.
Cabric et al., "Experimental Study of Spectrum Sensing Based on Energy Detection and Network Cooperation", Proc. of the 1st Int'l Workshop on Technology and Policy for Accessing Spectrum, 2006, retrieved at <<http://delivery.acm.org/10.1145/1240000/1234400/a12-cabric.pdf?key1=1234400&key2=4956848321&coll=GUIDE&dl=GUIDE&CFID=29023570&CFTOKEN=14990252, 8 pages.
Chandra et al., "Wireless Networking in the TV Bands", retrieved at http://sdr08.cs.ucdavis.edu/sdr-workshop.ppt, Apr. 1, 2009, 34 pages.
Chu, et al., "A Case for End System Multicast", Proceedings of the 2000 ACM SIGMETRICS International Conference. 28, Issue 1, Jun. 2000, pp. 1-12.
Chu, et al., "A Case for End SystemMulticast", Retrieved at <<http://delivery.acm.org/ 10.1145/340000/339337/p1-chu.pdf?key1=339337&key2=4147561621&coll=GUIDE&dl = GUIDE& CFID=68072143&CFTOKEN=60353992 >>, SIGMETRICS, 2000, pp. 1-12.
"Cognitive Radio Networks", retrieved at http://www.ece.gatech.edu/research/labs/bwn/CR/Projectdescription.html, Apr. 1, 2009, 13 pages.
Dandawate, et al., "Statistical Tests for Presence of Cyclostationarity", Retrieved at << http://ieeexplore.ieee.org/stamp/stamp.jsp?tp=& arnumber=317857&isnumber=7659 >>, IEEE Transactions on Signal Processing, vol. 42, No. 9, Sep. 1994, pp. 2355-2369.
Deb et al., "Dynamic Spectrum Access in DTV Whitespaces Design Rules, Architecture and Algorithms", ACM 978-1-60558-702-8/09/09, MobiCom '09, Sep. 20-25, 2009, 12 pages.
Web page for Ettus Research LLC, "The USRP Product Family", Mountain View, California, retrieved at<<http://www.ettus.com>>, retrieved on Mar. 31, 2009, 2 pages.
Ettus Research LLC, "USRP FAQ", Mountain View, California, retrieved at <<http://www.ettus.com/faq.html>>, retrieved retrieved on Mar. 31, 2009, 7 pages.
"FCC Adopts Rule for Unlicensed Use of Television White Spaces", Retrieved at <<http://radiomagonline.com/currents/news/fcc-adopts-rules-unlicensed-white-spaces-1105/>>, Nov. 5, 2008, pp. 4.
"FCC Adopts Rules for Unlicensed Use of Television White Spaces", news release from the Federal Communications Commission, Nov. 4, 2008, retrieved at <<hraunfoss.fcc.gov/edocs_public/attachmatch/DOC-286566A1.pdf>>, 2 pages.
FCC Media Bureau, "TVQ TV Database", Retrieved at: <<http://www.fcc.gov/mb/video/tvq. html>>, Dec. 24, 2009, 2 pages.
"FCC Acts to Expedite DTV Tranisition and Clarify DTV Build-Out Rules", news release from the Federal Communications Commission, Nov. 8, 2001, retrieved at http://www.fcc.gov/Bureaus/Mass_Media/News_Releases/2001/nrmm0114.html, 3 pages.
Final Office Action for U.S. Appl. No. 12/473,963, mailed on May 1, 2012, Ranveer Chandra, "Spectrum Assignment for Networks Over White Spaces and Other Portions of the Spectrum", 14 pgs.
Garroppo et al., "Notes on Implementing a IEEE 802.11s Mesh Point" retrieved at http://recerca.ac.upc.edu/eurongi08/slides/6-1-s.pdf, Apr. 1, 2009, 39 pages.
Goldsmith, Andrea Jo, "Design and Performance of High-Speed Communication Systems over Time-Varying Radio Channels", UC Berkeley, Berkeley, California, 1994, 210 pages.
Gurney et al., Geo-location Database Techniques for Incumbent Protection in the TV White Space, IEEE, 978-1-4244-2017-9/08, Jun. 6, 2008, 9 pages.
"IEEE 802.22 Working Group on WRANs" web page for IEEE 802 LAN/MAN Standards Committee, retrieved at <<http://www.ieee802.org/22/>>, retrieved on Mar. 31, 2009, 2 pages.
"Demonstrations and Experimentation", IEEE Symposia on New Frontiers in Dynamic Spectrum Access Networks, http://cms.comsoc.org/eprise/main/SiteGen/DYSPAN_2008/ Content/Home/demonstrations.html, retrieved Mar. 31, 2009, 13 pages.
Jones, et al., "FCC Press Release, Evaluation of the Performance of Prototype TV-Band White Space Devices", Retrieved at << http://online.wsj.com/public/resources/documents/ fcc10152008.pdf >>, Oct. 15, 2008, pp. 149.
Katabi, Dina, "The Use of IP Anycast for Building Efficient Multicast", Proceedings in Global Telecommunications Conference, Lab. for Computer Science, vol. 3, Dec. 5-9, 1999, pp. 1679-1688.
Kim, et al., "In-band Spectrum Sensing in Cognitive Radio Networks: Energy Detection or Feature Detection?", Retr'd at << http://fuxi.cs.txstate.edu/~nasdg/papers/2008mobicom/In-band spectrum

(56) References Cited

OTHER PUBLICATIONS sensing in cognitive radio networks energy detection or feature detection 2008.pdf >>, Proc. of 14th ACM Int'l Conf. Mobile computing and networking, Sep. 14-19, 2008, pp. 14-25.

Kim et al., "Fast Discovery of Spectrum Opportunities in Cognitive Radio Networks", Proceedings of the 3rd IEEE Symposium on New Frontiers in Dynamic Spectrum Access Networks, Oct. 14-17, 2008, retrieved at <<http://kabru.eecs.umich.edu//papers/ publications/2008/main.pdf>>, 12 pages.

Kim, et al., "In-band Spectrum Sensing in Cognitive Radio Networks: Energy Detection or Feature Detection?",Proc. of 14th ACM Int'l Conf. on Mobile computing and networking,Sep. 14-19, 2008, http://kabru.eecs.umich.edu//papers/publications/2008/com0950-km.pdf, pp. 14-25.

Kotz, et al., "Analysis of a Campus-wide Wireless Network". In Proceedings of the Eighth Annual International Conference on Mobile Computing and Networking, pp. 107-118. (MOBICOM'02, Sep. 23-26, 2002, Atlanta, Georgia, USA). Revised and corrected as Dartmouth CS Technical Report TR2002-432.

Liu, et al., "Sensing-based Opportunistic Channel Access", Retrieved at << http://www.cs.ucdavis.edu/~liu/paper/sensing.pdf >>, Mobile Networks and Applications, vol. 11, No. 4, Aug. 2006, pp. 1-28.

Liu, et al., "Sensing-based Opportunistic Channel Access", Retrieved at <<http://www.cs.ucdavis.edu/~liu/paper/sensing.pdf >>, Mobile Networks and Applications, vol. 11, No. 4, Aug. 2006, pp. 1-28.

"Longley-Rice Methodology for Evaluating TV Coverage and Interference.", Retrieved at << http://www.fcc.gov/Bureaus/Engineering_Technology/Documents/bulletins/oet69/oet69 .pdf >>, Feb. 6, 2004, pp. 15.

Matinmikko et al., "Cognitive Radio: An intelligent Wireless Communication System", Retrieved at << http://www.vtt.fi/inf/julkaisut/muut/2008/CHESS _Research_Report.pdf >>, Mar. 14, 2008, pp. 155.

Mishra et al., "How much white space is there?", Technical Report No. UCB/EECS-2009-3, Jan. 11, 2009, 16 pages.

Moscibroda et al., "Load-Aware Spectrum Distribution in Wireless LANs", IEEE International Conference on Network Protocols, Oct. 19-22, 2008, retrieved at <<http://www.ieee-icnp.org/2008/papers/Index14.pdf>>, pp. 137-146.

Nekovee, Maziar., "Quantifying the TV White Spaces Spectrum Opportunity for Cognitive Radio Access", Retrieved at << www.springerlink.com/index/p1hrw58u75027542.pdf >>, First International ICST Conference, EuropeComm, Aug. 11-13, 2009, pp. 46-57.

National Geophysical Data Center, "The Global Land One-Km Base Elevation Project (GLOBE), ", Retrieved at <<http://www.ngdc.noaa.gov/mgg/topo/globe.html >>, Retrieved Date: Dec. 24, 2009, pp. 2.

NYCwireless Testimony for NY City Council Hearing: The Regulation and Use of the Unallocated Portion of the Radio Spectrum, Also Known as White Spaces http://www.nycwireless.net/2008/09/nycwireless-testimony-for-ny-city-council-hearing-the-regulation-and-use-of-the-unallocated-portion-of-the-radio-spectrum-also-known-as-white-spaces/, Mar. 30, 2009, 3 pages.

Office action for U.S. Appl. No. 12/571,188, mailed on Oct. 25, 2012, Tan et al., "Radio Control Board for Software-Defined Radio Platform", 24 pages.

Office action for U.S. Appl. No. 12/535,415, mailed on Nov. 21, 2012, Tan et al., "Software-Defined Radio Using Multi-Core Processor", 15 pages.

Office Action for U.S. Appl. No. 12/473,963, mailed on Nov. 9, 2011, Ranveer Chandra, "Spectrum Assignment for Networks Over White Spaces and Other Portions of the Spectrum", 12 pgs.

Otsason et al., "Accurate GSM Indoor Localization", UbiComp Sep. 11-14, 2005, LNCS vol. 3660, 2005, pp. 141-158.

PCT International Search Report and Written Opinion for PCT Application No. PCT/US2010/036752 mailed May 13, 2011, 9 pgs.

PCT International Search Report and Written Opinion for PCT Application No. PCT/US2010/036756 mailed May 13, 2011, 9 pgs.

PCT International Search Report and Written Opinion for PCT Application No. PCT/US2011/0341302 mailed Dec. 28, 2011, 9 pgs.

Plummer Jr., et al., "A Cognitive Spectrum Assignment Protocol Using Distributed Conflict Graph Construction", << http://ieeexplore.ieee.org/stamp/stamp.jsp?arnumber=04455299 >>, In Proceedings IEEE MILCOM, Oct. 2007, pp. 1-7.

Plummer, et al., "A Cognitive Spectrum Assignment Protocol Using Distributed Conflict Graph Construction", Retrieved at << http://ieeexplore.ieee.org/stamp/stamp.jsp?arnumber=04455299 >>, In Proceedings IEEE MILCOM, Oct. 2007, pp. 1-7.

Radio Magazine, "FCC Adopts Rules for Unlicensed Use of Television White Spaces", Retrieved at <<http://radiomagonline.com/currents/news/fcc-adopts-rules-unlicensed-white-spaces-1105/ >>, Nov. 5, 2008, pp. 4.

Ratnasamy et al., "Revisiting IP Multicast", ACM, 1-59593-308-5/06/0009, SigComm '06, Sep. 11-15, 2006, 12 pages.

Rix et al., "Perceptual Evaluation of Speech Quality (PESQ)—A New Method for Speech Quality Assessment of Telephone Networks and Codecs", Proceedings of the 2001 IEEE International Conference Acoustics, Speech and Signal Processing, vol. 2, 2001, http://ieeexplore. ieee.org/stamp/stamp.jsp?tp=&isnumber=&arnumber=941023, retrieved on Apr. 1, 2009, 4 pages.

"Rosum Corporation", Retrieved at << http://rosum.com/ >>, Retrieved Date: Dec. 24, 2009, pp. 1.

Rosum Corporation, "Reliable, In-Building", Retrieved at << http://rosum.com/ >>, Retrieved Date: Dec. 24, 2009, pp. 1.

Sahai et al., Spectrum Sensing Fundamental Limits and Practical Challenges, Retrieved at: << http://www.eecs.berkeley.edu/~sahai/Presentations/Dyspan_2005 tutorial_part_I.pdf, 2005, 138 pages.

Web page for Scalable Network Technologies, Inc., Los Angeles, California, retrieved at << http://www.scalable-networks.com>>, retrieved on Mar. 31, 2009, 1 page.

Shellhammer et al., "Technical Challenges for Cognitive Radio in the TV White Space Spectrum", ITA Conference, San Diego, CA, Feb. 8-13, 2009, 11 pages.

"Show My White Space", Retrieved at << http://showmywhitespace.com/ >>, Retrieved Date: Dec. 24, 2009, pp. 2.

"Shuttle Radar Topograph Mission (SRTM)", Retrieved at << http://www2.jpl.nasa.gov/srtm/ >>, Retrieved Date: Dec. 24, 2009, pp. 2.

"Shuttle Radar Topography Mission (SRTM)", Retrieved at <<http://www2.jpl.nasa.gov/srtm/ >>, Retrieved Date: Dec. 24, 2009, pp. 2.

"Skyhook Wireless", Retrieved at << http://skyhookwireless.com/ >>, Retrieved Date: Dec. 24, 2009, pp. 6.

Stirling, "White Spaces—the New Wi-Fi?", Retrieved at << http://www.intellectbooks.co.uk/ File:download,id=761/JDTV.1.1.69.pdf >>, International Journal of Digital Television, vol. 1, No. 1, 2010, pp. 16.

Subramani, et al., "Spectrum Scanning and Reserve Channel Methods for Link Maintenance in Cognitive Radio Systems", Retrieved at << http://rose.bris.ac.uk /dspace/bitstream/1983/1232/1/siva_IEEE_VTC_spring%202008.pdf >>, Proceedings of the 67th IEEE Vehicular Technology Conference, VTC, May 11-14, 2008, pp. 1944-1948.

Subramani, et al., "Spectrum Scanning and Reserve Channel Methods for Link Maintenance in Cognitive Radio Systems", Retrieved at << http://rose.bris.ac.uk /dspace/bitstream/1983/1232/1/siva_IEEE_VTC_spring%202008.pdf >>, Proceedings of the 67th IEEE Vehicular Technology Conference, VTC, May 11-14, 2008, pp. 1944-1948.

Tan et al., "SORA: High Performance Software Radio Using General Purpose Multi-core Processors", Proceedings of the 6th USENIX Symposium of Networked Systems Design and Implementation, 2009, http://research.microsoft.com/pubs/79927/Sora-camera-ready.pdf, Apr. 1, 2009, 16 pages.

Tandra et al., "SNR Wall for Signal Detection", IEEE Journal of Selected Topics in Signal Processing, vol. 2, No. 1, Feb. 2008, pp. 4-17.

Texas Instruments, "Texas Instruments, 10-MHz to 66-MHz, 10:1 LVDS Serializer/Deserializer", <http://www.ti.com>, 2004, 29 pages.

"The ITS Irregular Terrain Model Algorithm, NTIA, Department of Commerce.", Retrieved at << http://flattop.its.bldrdoc.gov/itm.html >>, Retrieved Date: Dec. 24, 2009, pp. 2.

(56) References Cited

OTHER PUBLICATIONS

"TV Fool", Retrieved at << http://www.tvfool.com/ >>, Retrieved Date: Dec. 24, 2009, pp. 2.
Web page for "TV Fool", retrieved at http://www.tvfool.com, retrieved on Mar. 31, 2009, 4 pages.
Urkowitz, "Energy Detection of Unknown Deterministic Signals", Proceedings of the IEEE, vol. 55, No. 4, Apr. 1967, pp. 523-531.
Whitt, Richard., "Introducing the White Spaces Database Group", Retrieved at <<http://googlepublicpolicy.blogspot.com/2009/02/introducing-white-spaces-database-group.html >>, Feb. 4, 2009, pp. 4.
Yuan, et al., "KNOWS: Kognitiv Networking Over White Spaces", Retrieved at << http://citeseerx.ist.psu.edu/viewdoc/download?doi=10.1.1.123.4056&rep=rep1&type=pdf >>, IEEE Dynamic Spectrum Access Networks (DySPAN), Apr. 2007, pp. 12.

\* cited by examiner

Process carried out by Producer

US 8,627,189 B2

HIGH PERFORMANCE DIGITAL SIGNAL PROCESSING IN SOFTWARE RADIOS

BACKGROUND

Software-defined radio (SDR) holds the promise of fully programmable wireless communication systems, effectively supplanting conventional radio technologies, which typically have the lowest communication layers implemented primarily in fixed, custom hardware circuits. The SDR may include an architecture that optimizes hardware and software sections to cope up with relatively higher data rates transfer during a digital signal processing. In an implementation, the SDR—in wireless communication systems—uses the hardware section to support the relatively higher data rates transfer, which can be implemented by software algorithms in the software section.

In wireless communication systems, streams of data can be transmitted and/or received by the SDR architecture. The streams of data can include sequence of bits that were encoded at a transmitting side, and decoded at a receiving end. In an implementation, decoding errors may result due to different sources, such as, noise, interferences, and the like, during the transmission of the sequence of bits (i.e., streams of data).

SUMMARY

The following presents a simplified summary in order to provide a basic understanding of some aspects of the disclosed subject matter. This summary is not an extensive overview of the disclosed subject matter, and is not intended to identify key/critical elements or to delineate the scope of such subject matter. A purpose of the summary is to present some concepts in a simplified form as a prelude to the more detailed description that is presented later.

In an implementation, software-defined radio (SDR) architecture includes transmitting and receiving of data streams. During the transmitting and/or receiving of the data streams, a look-up table (LUT) and Single Instruction Multiple Data (SIMD) instruction sets can be extensively used in a transmitting block and/or a receiving block of the SDR architecture.

To the accomplishment of the foregoing and related ends, certain illustrative aspects are described herein in connection with the following description and the annexed drawings. These aspects are indicative of various ways in which the disclosed subject matter can be practiced, all of which are intended to be within the scope of the disclosed subject matter. Other advantages and novel features can become apparent from the following detailed description when considered in conjunction with the drawings.

BRIEF DESCRIPTION OF THE DRAWINGS

The detailed description is set forth with reference to the accompanying drawing figures. In the figures, the left-most digit(s) of a reference number identifies the figure in which the reference number first appears. The use of the same reference numbers in different figures indicates similar or identical items or features.

DETAILED DESCRIPTION

Overview

Figure 1:
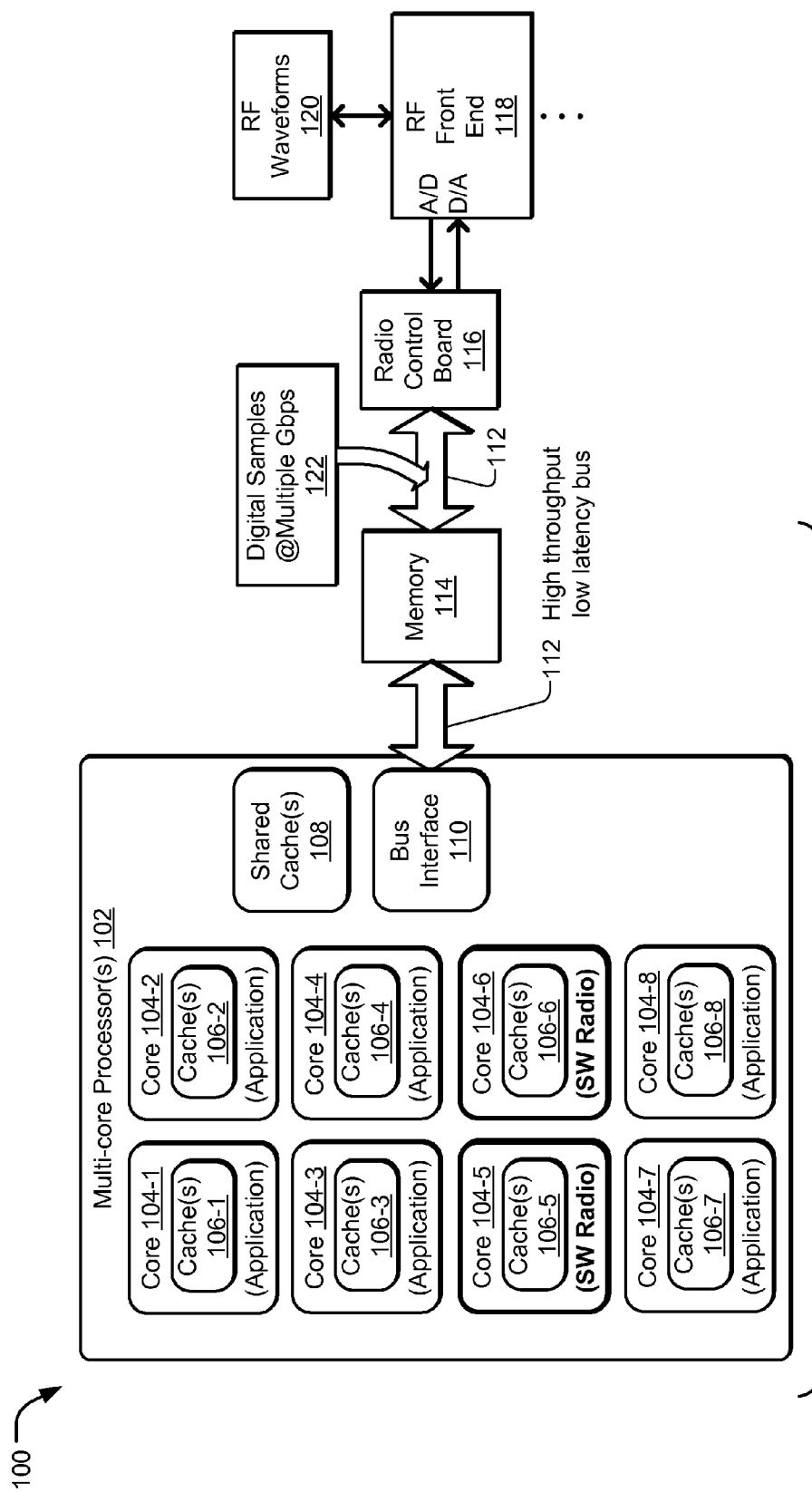
FIG. 1 illustrates an exemplary architecture according to some implementations disclosed herein.

Implementations disclosed herein present a fully programmable software-defined radio (SDR) platform and system able to be implemented on general-purpose computing devices, including personal computer (PC) architectures. Implementations of the SDR herein combine the performance and fidelity of specialized-hardware-based SDR platforms with the programmability and flexibility of general-purpose processor (GPP) SDR platforms. Implementations of the SDR herein use both hardware and software techniques to address the challenges of using general-purpose computing device architectures for high-speed SDR platforms. In some implementations of the SDR herein, hardware components include a radio front end for radio frequency (RF) reception and transmission, and a radio control board for high-throughput and low-latency data transfer between the radio front end and a memory and processor on the computing device.

Implementations of the SDR herein make use of features of multi-core processor architectures to accelerate wireless protocol processing and satisfy protocol-timing requirements. For example, implementations herein may use dedicated CPU cores, lookup tables stored in large low-latency caches, and SIMD (Single Instruction Multiple Data) processor extensions for carrying out highly efficient physical layer processing on general-purpose multiple-core processors. Some exemplary implementations described herein include an SDR that seamlessly interoperates with commercial 802.11a/b/g network interface controllers (NICs), and achieve performance that is equivalent to that of commercial NICs at multiple different modulations.

Furthermore, some implementations are directed to a fully programmable software radio platform and system that provides the high performance of specialized SDR architectures on a general-purpose computing device, thereby resolving the SDR platform dilemma for developers. Using implementations of the SDR herein, developers can implement and experiment with high-speed wireless protocol stacks, e.g., IEEE 802.11a/b/g/n, using general-purpose computing devices. For example, using implementations herein, developers are able to program in familiar programming environments with powerful programming and debugging tools on standard operating systems. Software radios implemented on the SDR herein may appear like any other network device, and users are able to run unmodified applications on the software radios herein while achieving performance similar to commodity hardware radio devices.

Furthermore, implementations of the SDR herein use both hardware and software techniques to address the challenges of using general-purpose computing device architectures for achieving a high-speed SDR. Implementations are further directed to an inexpensive radio control board (RCB) coupled with a radio frequency (RF) front end for transmission and reception. The RCB bridges the RF front end with memory of the computing device over a high-speed and low-latency PCIe (Peripheral Component Interconnect Express) bus. By using a PCIe bus, some implementations of the RCB can support 16.7 Gbps throughput (e.g., in PCIe ×8 mode) with sub-microsecond latency, which together satisfies the throughput and timing requirements of modern wireless protocols, while performing all digital signal processing using the processor and memory of a general purpose computing device. Further, while examples herein use PCIe protocol, other high-bandwidth protocols may alternatively be used, such as, for example, HyperTransport™ protocol.

Additionally, to meet physical layer (PHY) processing requirements, implementations of the SDR herein leverage various features of multi-core architectures in commonly available general-purpose processors. Implementations of the SDR herein also include a software arrangement that explicitly supports streamlined processing to enable components of a signal-processing pipeline to efficiently span multiple cores. For example, implementations herein change the conventional implementation of PHY components to extensively take advantage of lookup tables (LUTs), thereby trading off memory in place of computation, which results in reduced processing time and increased performance. For instance, implementations herein substantially reduce the computational requirements of PHY processing by utilizing large, low-latency caches available on conventional GPPs to store the LUTs that have been previously computed. In addition, implementations of the SDR herein use SIMD (Single Instruction Multiple Data) extensions in existing processors to further accelerate PHY processing. Furthermore, to meet the real-time requirements of high-speed wireless protocols, implementations of the SDR herein provide a new kernel service, core dedication, which allocates processor cores exclusively for real-time SDR tasks. The core dedication can be used to guarantee the computational resources and precise timing control necessary for SDR on a general-purpose computing device. Thus, implementations of the SDR herein are able fully support the complete digital processing of high-speed radio protocols, such as 802.11a/b/g/n, CDMA, GSM, WiMax and various other radio protocols, while using a general purpose computing device. Further, it should be noted that while various radio protocols are discussed in the examples herein, the implementations herein are not limited to any particular radio protocol.

Architecture Implementations

FIG. 1 illustrates an exemplary architecture of an SDR platform and system 100 according to some implementations herein. The SDR platform and system 100 includes one or more multi-core processors 102 having a plurality of cores 104. In the illustrated implementation, multi-core processor 102 has eight cores 104-1, . . . , 104-8, but other implementations herein are not limited to any particular number of cores. Each core 104 includes one or more corresponding onboard local caches 106-1, . . . , 106-8 that are used by the corresponding core 104-1, . . . 104-8, respectively, during processing. Additionally, multi-core processor 102 may also include one or more shared caches 108 and a bus interface 110. Examples of suitable multi-core processors include the Xenon™ processor available from Intel Corporation of Santa Clara, Calif., USA, and the Phenom™ processor available from Advanced Micro Devices of Sunnyvale, Calif., USA, although implementations herein are not limited to any particular multi-core processor. In the example illustrated, two of the cores, cores 104-5 and 104-6 are performing processing for the SDR, while the remaining cores 104-1 through 104-4 and 104-7 through 104-8 are performing processing for other applications, the operating system, or the like, as will be described additionally below. Further, in some implementations, two or more multi-core processors 102 can be provided, and cores 104 across the two or more multi-core processors can be used for SDR processing.

Multi-core processor 102 is in communication via bus interface 110 with a high-throughput, low-latency bus 112, and thereby to a system memory 114. As mentioned above, bus 112 may be a PCIe bus or other suitable bus having a high data throughput with low latency. Further, bus 112 is also in communication with a radio control board (RCB) 116. As is discussed further below, radio control board 116 may be coupled to an interchangeable radio front end (RF front end) 118. The RF front end 118 is a hardware module that receives and/or transmits radio signals through an antenna (not shown in FIG. 1). In some implementations of the SDR architecture herein, the RF front end 118 represents a well-defined interface between the digital and analog domains. For example, in some implementations, RF front end 118 may contain analog-to-digital (A/D) and digital-to-analog (D/A) converters, and necessary circuitry for radio frequency transmission, as is discussed further below.

During receiving, the RF front end 118 acquires an analog RF waveform 120 from the antenna, possibly down-converts the waveform to a lower frequency, and then digitizes the analog waveform into discrete digital samples 122 before transferring the digital samples 122 to the RCB 116. During transmitting, the RF front end 118 accepts a stream of software-generated digital samples 122 from a software radio stack 124 (i.e., software that generates the digital samples, as discussed below), and synthesizes the corresponding analog waveform 120 before emitting the waveform 120 via the antenna. Since all signal processing is done in software on the multi-core processor 102, the design of RF front end 118 can be rather generic. For example, RF front end 118 can be implemented in a self-contained module with a standard interface to the RCB 116. Multiple wireless technologies defined on the same frequency band can use the same RF front end hardware 118. Furthermore, various different RF front ends 118 designed for different frequency bands can be coupled to radio control board 116 for enabling radio communication on various different frequency bands. Therefore, implementations herein are not limited to any particular frequency or wireless technology.

According to some implementations herein, RCB 116 is a PC interface board optimized for establishing a high-throughput, low-latency path for transferring high-fidelity digital signals between the RF front end 118 and memory 114. The interfaces and connections between the radio front end 118 and multi-core processor 102 must enable sufficiently high throughput to transfer high-fidelity digital waveforms. For instance, in order to support a 20 MHz channel for 802.11 protocol, the interfaces should sustain 1.28 Gbps. By way of comparison, conventional interfaces, such as USB 2.0 ($\leq$480 Mbps) or Gigabit Ethernet ($\leq$1 Gbps) are not able to meet this requirement. Accordingly, to achieve the required system throughput, some implementations of the RCB 116 use a high-speed, low-latency bus 112, such as PCIe. With a maximum throughput of 64 Gbps (e.g., PCIe ×32) and sub-microsecond latency, PCIe is easily able to support multiple gigabit data rates for sending and receiving wireless signals over a very wide band or over many MIMO channels. Further, the PCIe interface is typically common in many conventional general-purpose computing devices.

A role of the RCB 116 is to act as a bridge between the synchronous data transmission at the RF front end 118 and the asynchronous processing on the processor 102. The RCB 116 implements various buffers and queues, together with a large onboard memory, to convert between synchronous and asynchronous streams and to smooth out bursty transfers between the RCB 116 and the system memory 114. The large onboard memory further allows caching of pre-computed waveforms for quick transmission of the waveforms, such as when acknowledging reception of a transmission, thereby adding additional flexibility for software radio processing.

Finally, the RCB 116 provides a low-latency control path for software to control the RF front end hardware 118 and to ensure that the RF front end 118 is properly synchronized with the processor 102. For example, wireless protocols have multiple real-time deadlines that need to be met. Consequently, not only is processing throughput a critical requirement, but the processing latency should also meet certain response deadlines. For example, some Media Access Control (MAC) protocols also require precise timing control at the granularity of microseconds to ensure certain actions occur at exactly pre-scheduled time points. The RCB 116 of implementations herein also provides for such low latency control. Additional details of implementations of the RCB 116 are described further below.

Exemplary Computing Device Implementation

Figure 2:
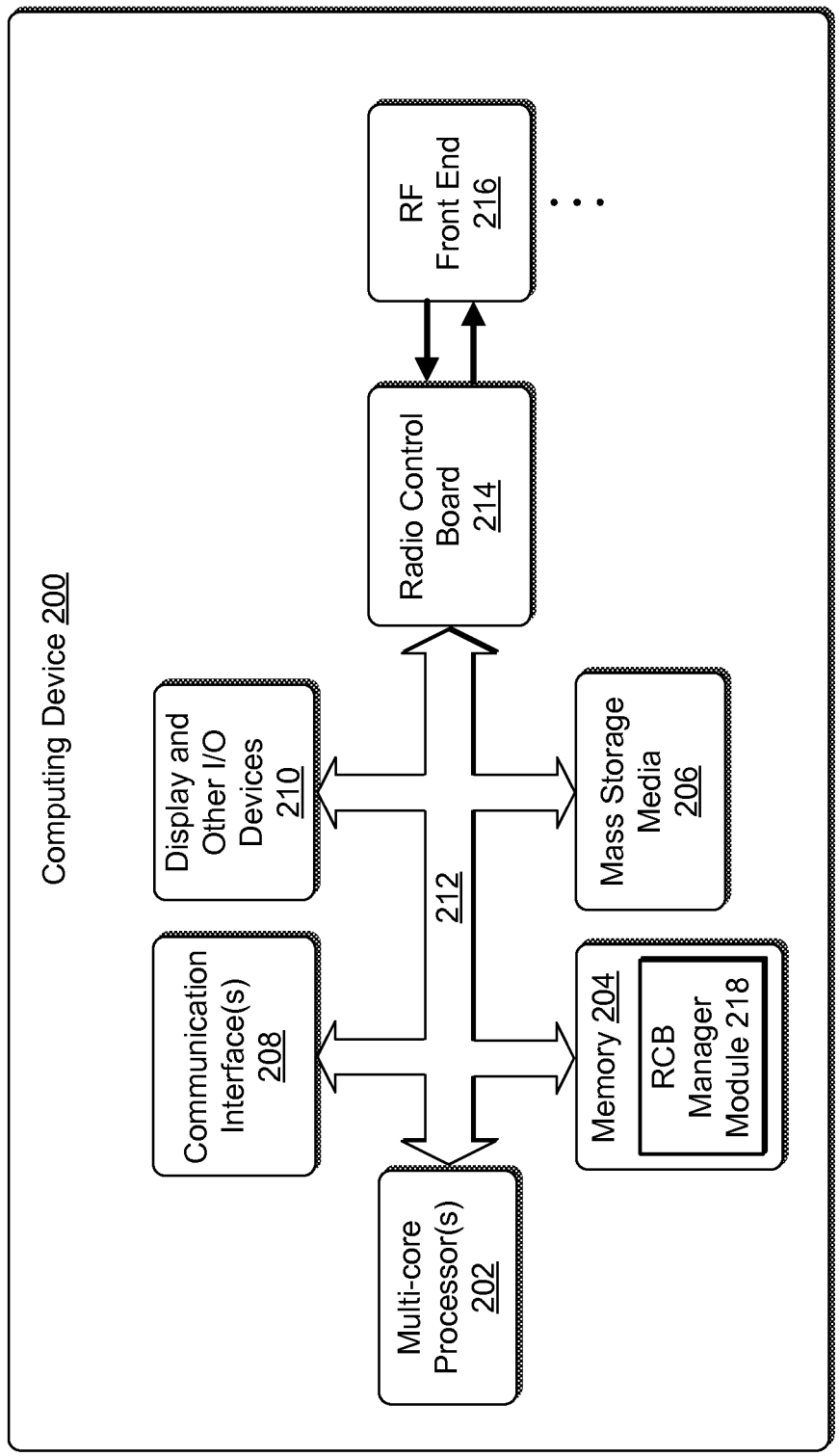
FIG. 2 illustrates an exemplary hardware and logical configuration of a computing device according to some implementations.

FIG. 2 illustrates an exemplary depiction of a computing device 200 that can be used to implement the SDR implementations described herein, such as the SDR platform and system 100 described above with reference to FIG. 1. The computing device 200 includes one or more multi-core processors 202, a memory 204, one or more mass storage devices or media 206, communication interfaces 208, and a display and other input/output (I/O) devices 210 in communication via a system bus 212. Memory 204 and mass storage media 206 are examples of computer-readable storage media able to store instructions which cause computing device 200 to perform the various functions described herein when executed by the processor(s) 202. For example, memory 204 may generally include both volatile memory and non-volatile memory (e.g., RAM, ROM, or the like). Further, mass storage media 206 may generally include hard disk drives, solid-state drives, removable media, including external and removable drives, memory cards, Flash memory, or the like. The computing device 200 can also include one or more communication interfaces 208 for exchanging data with other devices, such as via a network, direct connection, or the like, as discussed above. The display and other input/output devices 210 can include a specific output device for displaying information, such as a display, and various other devices that receive various inputs from a user and provide various outputs to the user, and can include, for example, a keyboard, a mouse, audio input/output devices, a printer, and so forth.

Computing device 200 further includes radio control board 214 and RF front end 216 for implementing the SDR herein. For example, system bus 212 may be a PCIe compatible bus, or other suitable high throughput, low latency bus. Radio control board 214 and RF front end 216 may correspond to radio control board 116 and RF front end 118 described above with reference to FIG. 1, and as also described below, such as with reference to FIG. 3. Furthermore, an RCB control module 218 may be stored in memory 204 or other computer-readable storage media for controlling operations on RCB 214, as is described additionally below. The computing device 200 described herein is only one example of a computing environment and is not intended to suggest any limitation as to the scope of use or functionality of the computer architectures that can implement the SDR herein. Neither should the computing device 200 be interpreted as having any dependency or requirement relating to any one or combination of components illustrated in the computing device 200.

Furthermore, implementations of SDR platform and system 100 described above can be employed in many different computing environments and devices for enabling a software-defined radio in addition to the example of computing device 200 illustrated in FIG. 2. Generally, many of the functions described with reference to the figures can be implemented using software, hardware (e.g., fixed logic circuitry), manual processing, or a combination of these implementations. The term "logic", "module" or "functionality" as used herein generally represents software, hardware, or a combination of software and hardware that can be configured to implement prescribed functions. For instance, in the case of a software implementation, the term "logic," "module," or "functionality" can represent program code (and/or declarative-type instructions) that perform specified tasks when executed on a processing device or devices (e.g., CPUs or processors). The program code can be stored in one or more computer readable memory devices, such as memory 204 and/or mass storage media 206, or other computer readable storage media. Thus, the methods and modules described herein may be implemented by a computer program product. The computer program product may include computer-readable media having a computer-readable program code embodied therein. The computer-readable program code may be adapted to be executed by one or more processors to implement the methods and/or modules of the implementations described herein. The terms "computer-readable storage media", "processor-accessible storage media", or the like, refer to any kind of machine storage medium for retaining information, including the various kinds of memory and storage devices discussed above.

Radio Control Board

Figure 3:
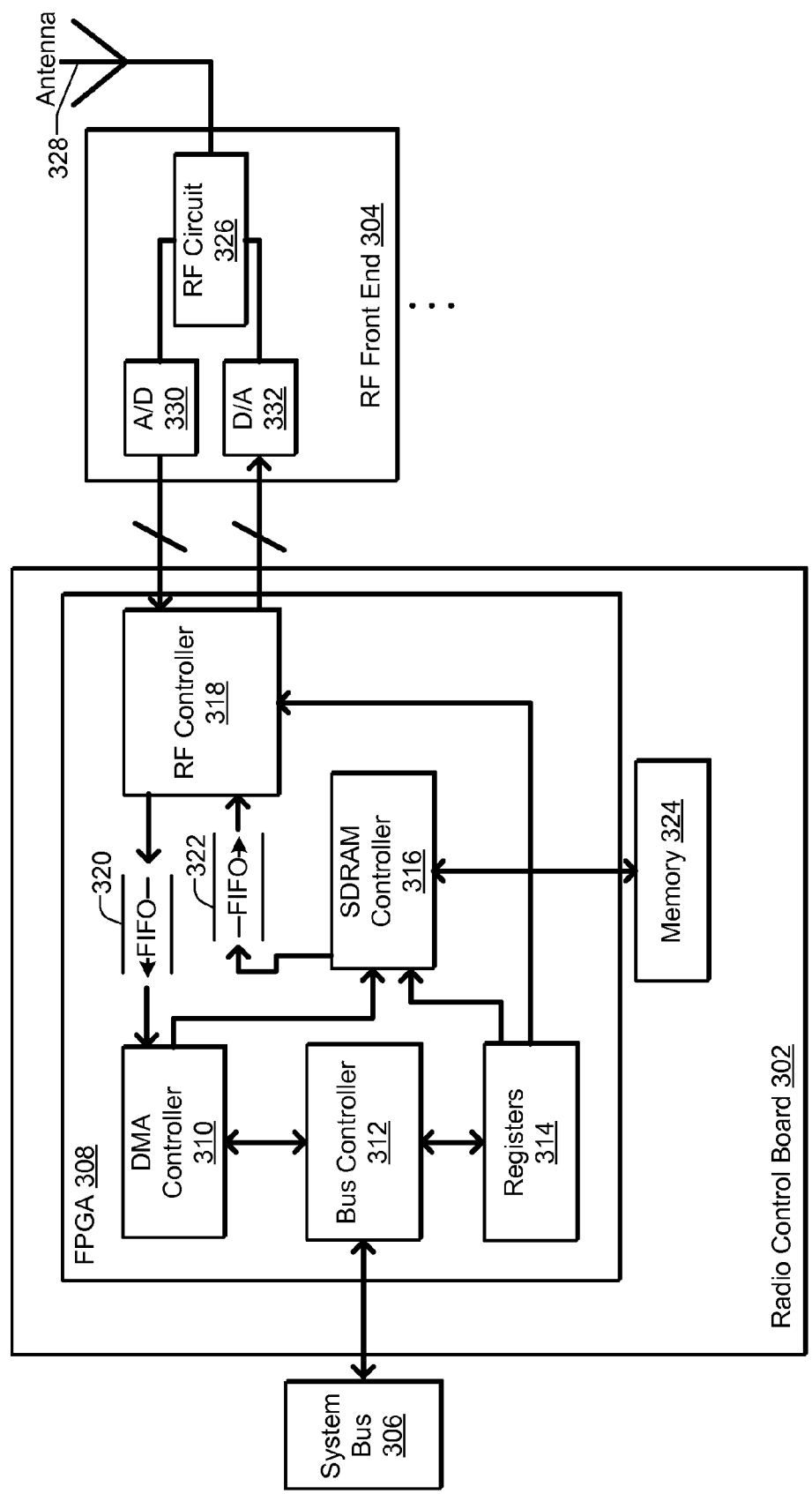
FIG. 3 illustrates a representation of an exemplary radio control board and RF front end according to some implementations.

FIG. 3 illustrates an exemplary implementation of a radio control board (RCB) 302 and RF front end 304, that may correspond to the RCB 116, 214 and RF front end 118, 216 described above. In the example illustrated, RCB 302 includes functionality for controlling the transfer of data between the RF front end 304 and a system bus 306, such as buses 112, 212 discussed above. In the illustrated embodiment, the functionality is a field-programmable gate array (FPGA) 308, which may be a Virtex-5 FPGA available from Xilinx, Inc., of San Jose, Calif., USA, one or more other suitable FPGAs, or other equivalent circuitry configured to accomplish the functions described herein. RCB 302 includes a direct memory access (DMA) controller 310, a bus controller 312, registers 314, an SDRAM controller 316, and an RF controller 318. RCB 302 further includes a first FIFO buffer 320 for acting as a first FIFO for temporarily storing digital samples received from RF front end 304, and a second FIFO buffer 322 for temporarily storing digital samples to be transferred to RF front end 304. The DMA controller 310 controls the transfer of received digital samples to the system bus 306 via the bus controller 312. SDRAM controller 316 controls the storage of data in onboard memory 324, such as digital samples, pre-generated waveforms, and the like. As an example only, memory 324 may consist of 256 MB of DDR2 SDRAM.

The RCB 302 can connect to various different RF front ends 304. One suitable such front end 304 is available from Rice University, Houston, Tex., USA, and is referred to as the Wireless Open-Access Research Platform (WARP) front end. The WARP front end is capable of transmitting and receiving a 20 MHz channel at 2.4 GHz or 5 GHz. In some implementations, RF front end 304 includes an RF circuit 326 configured as an RF transceiver for receiving radio waveforms from an antenna 328 and for transmitting radio waveforms via antenna 328. RF front end 304 further may include an analog-to-digital converter 330 and a digital-to-analog converter 332. As discussed above, analog-to-digital converter 330 converts received radio waveforms to digital samples for processing, while digital-to-analog converter 332 converts digital samples generated by the processor to radio waveforms for transmission by RF circuit 326. Furthermore, it should be noted that implementations herein are not limited to any particular front end 304, and in some implementations, the entire front end 304 may be incorporated into RCB 302. Alternatively, in other implementations, analog-to-digital converter 330 and digital-to-analog converter 332 may be incorporated into RCB 302, and RF front end 304 may merely have an RF circuit 326 and antenna 328. Other variations will also be apparent in view of the disclosure herein.

In the implementation illustrated in FIG. 3, the DMA controller 310 and bus controller 312 interface with the memory and processor on the computing device (not shown in FIG. 3) and transfer digital samples between the RCB 302 and the system memory on the computing device, such as memory 114, 204 discussed above. RCB software control module 218 discussed above with reference to FIG. 2 sends commands and reads RCB states through RCB registers 314. The RCB 302 further uses onboard memory 324 as well as small FIFO buffers 320, 322 on the FPGA 308 to bridge data streams between the processor on the computing device and the RF front end 304. When receiving radio waveforms, digital signal samples are buffered in on-chip FIFO buffer 320 and delivered into the system memory on the computing device when the digital samples fit in a DMA burst (e.g., 128 bytes). When transmitting radio waveforms, the large RCB memory 324 enables implementations of the RCB manager module 218 (e.g., FIG. 2) to first write the generated samples onto the RCB memory 324, and then trigger transmission with another command to the RCB. This functionality provides flexibility to the implementations of the SDR manager module 218 for pre-calculating and storing of digital samples corresponding to several waveforms before actually transmitting the waveforms, while allowing precise control of the timing of the waveform transmission.

It should be noted that in some implementations of the SDR herein, a consistency issue may be encountered in the interaction between operations carried out by DMA controller 310 and operations on the processor cache system. For example, when a DMA operation modifies a memory location that has been cached in the processor cache (e.g., L2 or L3 cache), the DMA operation does not invalidate the corresponding cache entry. Accordingly, when the processor reads that location, the processor might read an incorrect value from the cache. One naive solution is to disable cached accesses to memory regions used for DMA, but doing so will cause a significant degradation in memory access throughput.

Figure 4:
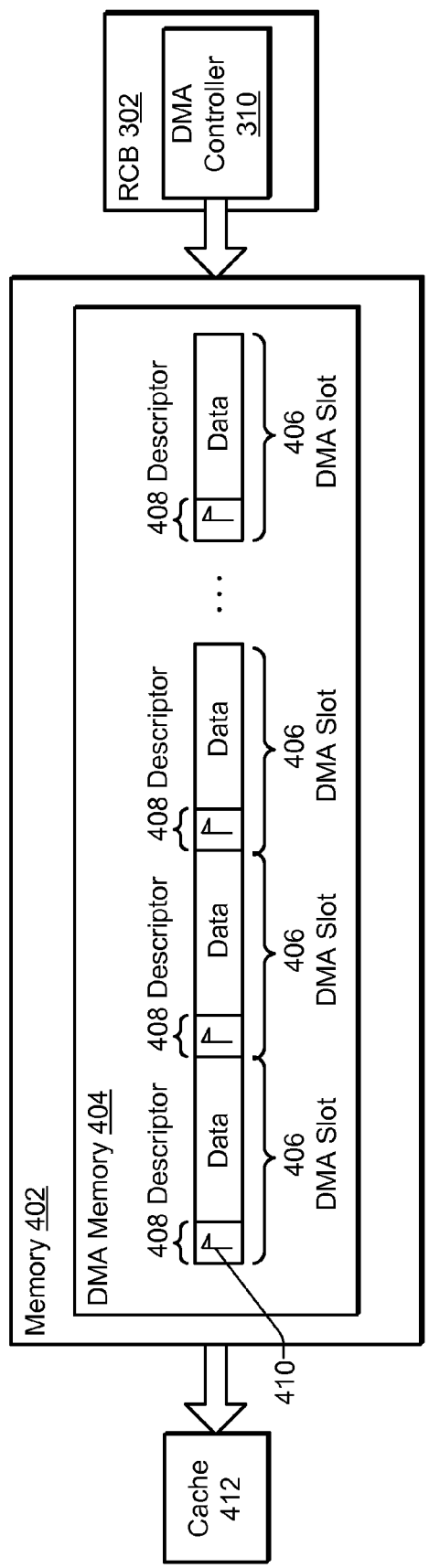
FIG. 4 illustrates exemplary DMA memory access according to some implementations.

As illustrated in FIG. 4, implementations herein address this issue by using a smart-fetch strategy, thereby enabling implementations of the SDR to maintain cache coherency with DMA memory without drastically sacrificing throughput. FIG. 4 illustrates a memory 402 which may correspond to system memory 114, 204 discussed above, and which includes a portion set aside as DMA memory 404 that can be directly accessed by DMA controller 310 on the RCB 302 for storing digital samples as data. In some implementations, the SDR organizes DMA memory 404 into small slots 406, whose size is a multiple of the size of a cache line. Each slot 406 begins with a descriptor 408 that contains a flag 410 or other indicator to indicate whether the data has been processed. The RCB 302 sets the flag 410 after DMA controller 310 writes a full slot of data to DMA memory 404. The flag 410 is cleared after the processor processes all data in the corresponding slot in the cache 412, which may correspond to caches 106 and/or 108 described above. When the processor moves to a cache location corresponding to a new slot 406, the processor first reads the descriptor of the slot 406, causing a whole cache line to be filled. If the flag 410 is set (e.g., a value of "1"), the data just fetched is valid and the processor can continue processing the data. Otherwise, if the flag is not set (e.g., a value of "0"), the DMA controller on the RCB has not updated this slot 406 with new data, and the processor explicitly flushes the cache line and repeats reading the same location. The next read refills the cache line, loading the most recent data from DMA memory 404. Accordingly, the foregoing process ensures that the processor does not read an incorrect value from the cache 412. Furthermore, while an exemplary RCB 302 has been illustrated and described, it will be apparent to those of skill in the art in light of the disclosure here in that various other implementations of the RCB 302 also fall within the scope of the disclosure herein.

SDR Software Implementations

Figure 5:
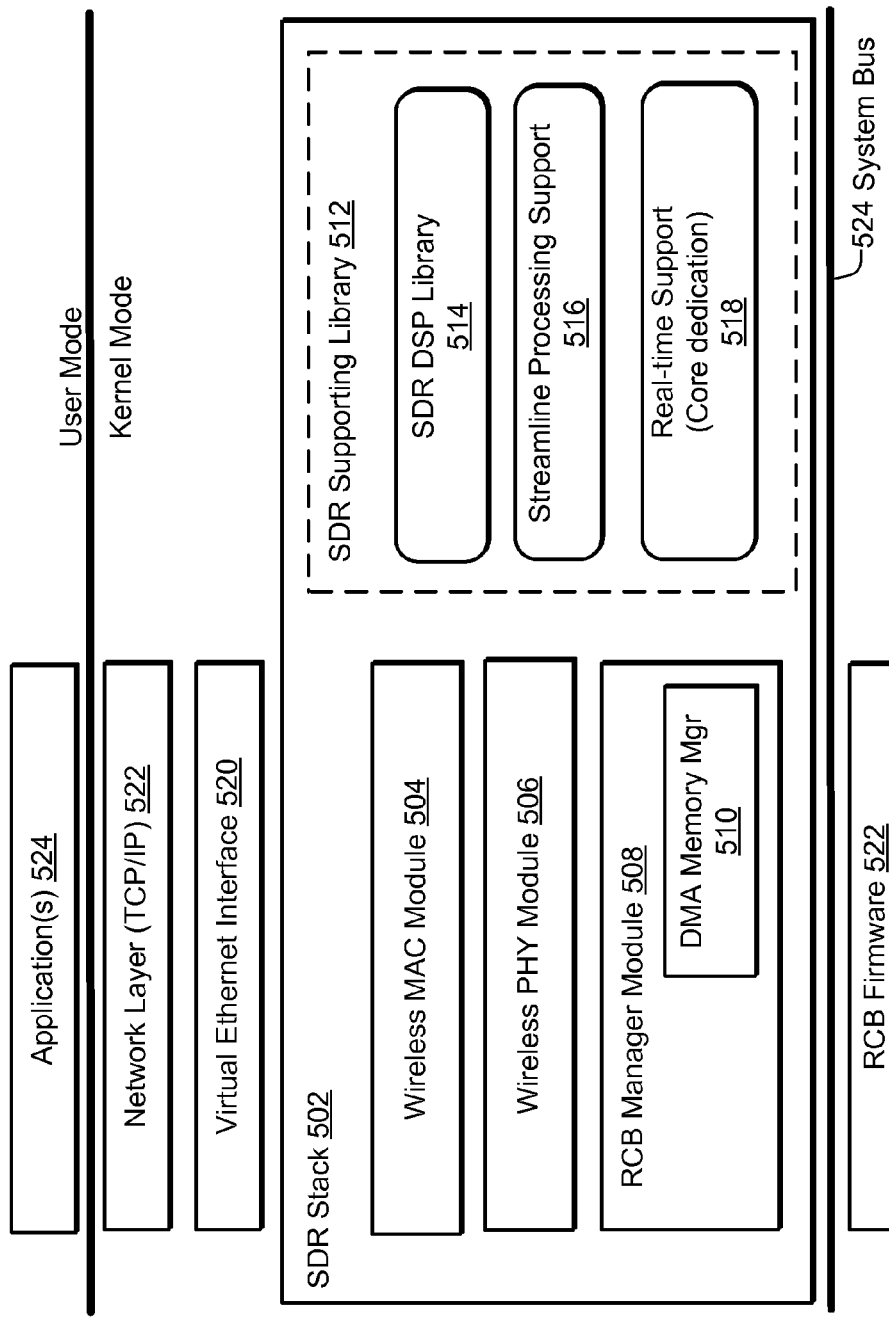
FIG. 5 illustrates an exemplary logical configuration according to some implementations.

FIG. 5 illustrates an exemplary implementation of a software and logical architecture of the SDR herein showing a number of software components and a logical arrangement of the SDR. An SDR stack 502 includes a wireless MAC layer module 504, a wireless physical layer (PHY) module 506, and an RCB manager module 508 that includes a DMA memory manager 510, and that may correspond to RCB manager 218, discussed above. These components provide for system support, including driver framework, memory management, streamline processing, and the like. The role of the PHY module 506 is to convert information bits into a radio waveform, or vice versa. The role of the MAC layer module 504 is to coordinate transmissions in wireless networks to avoid collisions. Also included is an SDR supporting library 512 that includes an SDR Digital Signal Processing (DSP) library 514, streamline processing support 516 and real-time support 518 (e.g., for ensuring core dedication). The SDR stack software components may exist at various times in system memory, cache, and/or mass storage or other computer readable storage media, as is known in the art.

The software components in implementations of the SDR herein provide necessary system services and programming support for implementing various wireless PHY and MAC protocols in a general-purpose operating system, such as Windows® XP, Windows Vista®, Windows® 7, Linux®, Mac OS® X, or other suitable operating system. In addition to facilitating the interaction with the RCB, the implementations of the SDR stack 502 provide a set of techniques to greatly improve the performance of PHY and MAC processing on a general-purpose processor. To meet the processing and real-time requirements, these techniques make full use of various features in multi-core processor architectures, including the extensive use of lookup tables (LUTs), substantial data-parallelism with processor SIMD extensions, the efficient partitioning of streamlined processing over multiple cores, and exclusive dedication of cores for software radio tasks.

Implementations of the SDR software may be written in any suitable programming language(s). For example, in some implementations, the software may be written in C, with, additionally, some assembly language for performance-critical processing. Further, some implementations of the SDR stack 502 may be implemented as a network device driver on a general-purpose operating system. Thus, RCB manager module 508 functions as a driver in the operating system for operating and managing the RCB and may include a PCIe driver for enabling use of the PCIe system bus. The SDR stack 502 exposes a virtual Ethernet interface 520 to the upper TCP/IP layer 522 of the kernel side, thereby enabling the SDR to appear and function as a network device. Since any software radio implemented on the SDR herein can appear as a normal network device, all existing network applications 524 used by a user are able to execute and interact with the SDR in an unmodified form. Further, on the other end, the SDR stack logically interacts with RCB firmware 522 via the system bus 524, which may be a PCIe system bus, as discussed above.

In some implementations of the SDR herein, SDR DSP processing library 514 extensively exploits the use of look-up tables (LUTs) and SIMD instructions to optimize the performance of PHY algorithms. For example, more than half of the PHY algorithms can be replaced with LUTs. Some LUTs are straightforward pre-calculations, others require more sophisticated implementations to keep the LUT size small. For instance, in the soft-demapper example discussed below, the LUT size (e.g., 1.5 KB for 802.11a/g 54 Mbps modulation) can be greatly reduced by exploiting the symmetry of the algorithm. Further, in the exemplary WiFi implementation described below, the overall size of the LUTs used in 802.11a/g is around 200 KB and in 802.11b is around 310 KB, both of which fit comfortably within the L2 caches of conventional multi-core processors.

Further, as discussed above, some implementations use SIMD (Single Instruction Multiple Data) instructions, such as the SSE2 (Streaming SMID Extensions 2) instruction set designed for Intel CPUs for speeding parallel processing of large numbers of data points, such as when processing digital samples. Since the SSE registers are 128 bits wide while most PHY algorithms require only 8-bit or 16-bit fixed-point operations, one SSE instruction can perform 8 or 16 simultaneous calculations. SSE2 also has rich instruction support for flexible data permutations, and most PHY algorithms, e.g., Fast Fourier Transform (FFT), Finite Impulse Response (FIR) Filter and Viterbi decoder algorithms, can fit naturally into this SIMD model. For example, the implementations of the Viterbi decoder according to the SDR herein uses only 40 cycles to compute the branch metric and select the shortest path for each input. As a result, Viterbi implementations can handle 802.11a/g at 54 Mbps modulation using only one 2.66 GHz CPU core in a multi-core processor, whereas conventional designs had to rely on specialized hardware implementations.

Additionally, it should be noted that other brands of processor architectures, such processors available from AMD, and PowerPC® processors available from Apple Inc. of Cupertino, Calif., USA, have very similar SIMD models and instruction sets that can be similarly utilized. For example, AMD's Enhanced 3DNow!® processor includes an SSE instruction set plus a set of DSP (Digital Signal Processor) extensions. The optimization techniques described herein can be directly applied to these and other GPP architectures as well. An example of a functional block using SIMD instruction optimizations is discussed further below.

Figure 6A:
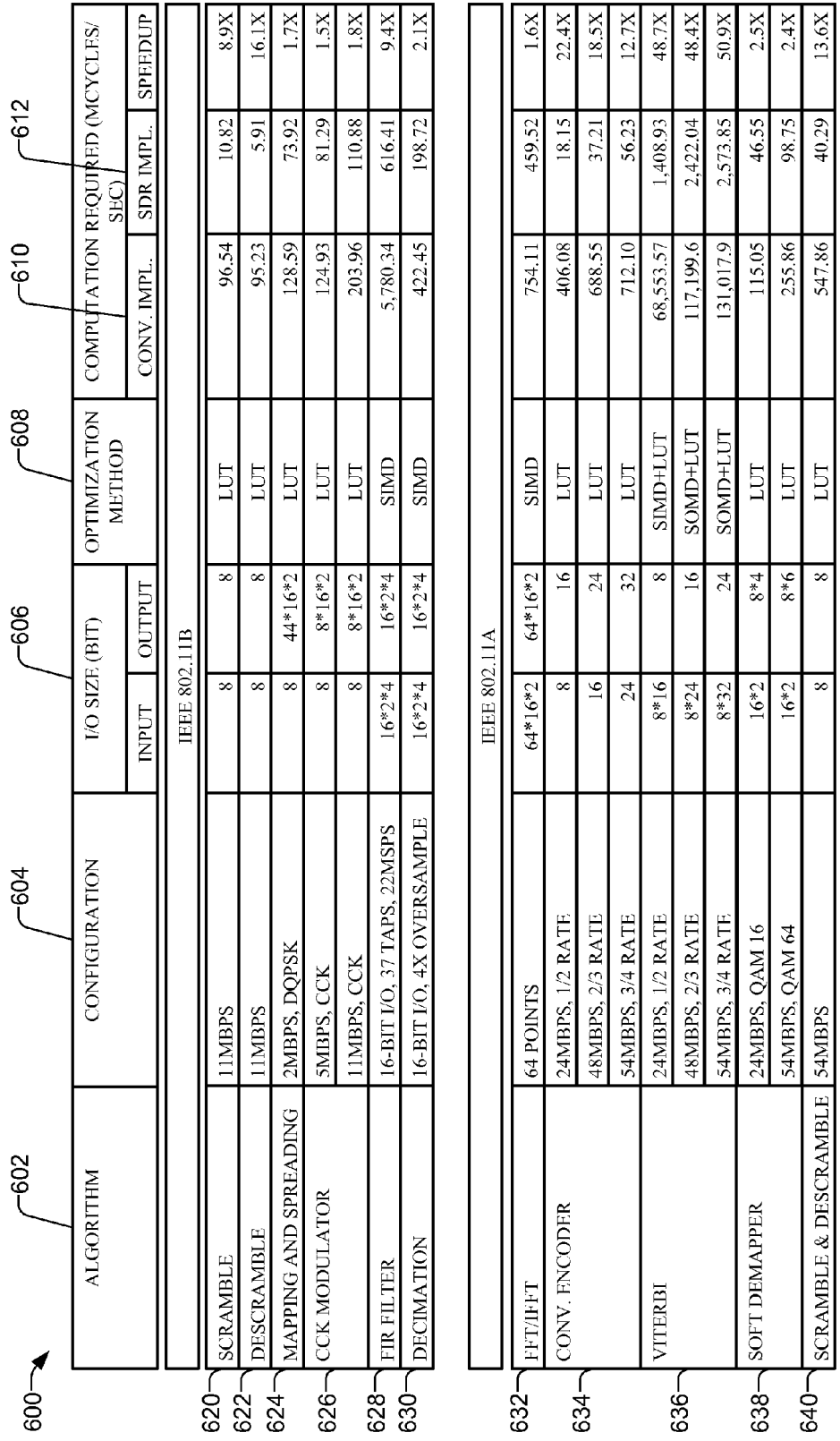
FIG. 6A illustrates an algorithm optimization table according to some implementations.

FIG. 6A illustrates an algorithm optimization table 600 that summarizes some PHY processing algorithms implemented in the SDR herein, together with the LUT and SIMD optimization techniques applied for improving the processing speed. The algorithm table 600 includes an algorithm identification column 602, a configuration column 604, and I/O size column 606, an optimization method column 608, number of computations required for a conventional implementation column 610, computations required for the SDR implementation 612, and the amount of speed up 614 gained by the optimization. For example, for the IEEE 802.11b standard, algorithms that maybe optimize using LUTs according to the SDR herein include the scramble algorithm 620, the descramble algorithm 622, the mapping and spreading algorithm 624, and the CCK (Complementary Code Keying) modulator algorithm 626, while algorithms that maybe optimized using SIMD extensions include the FIR filter 628, and the decimation algorithm 630. Additionally, for the IEEE 802.11a standard, algorithms that maybe optimized using SIMD extensions include the FFT/IFFT (Fast Fourier Transform/Inverse Fast Fourier Transform) algorithm 632, algorithms that may be optimized using LUTs according to the SDR herein include the convolutional encoder algorithm 634, the Viterbi algorithm 636, the soft demapper algorithm 638, and the scramble and descramble algorithms 640. Further, the Viterbi algorithm 636 may also be further optimized using SIMD extensions.

Figure 6B:
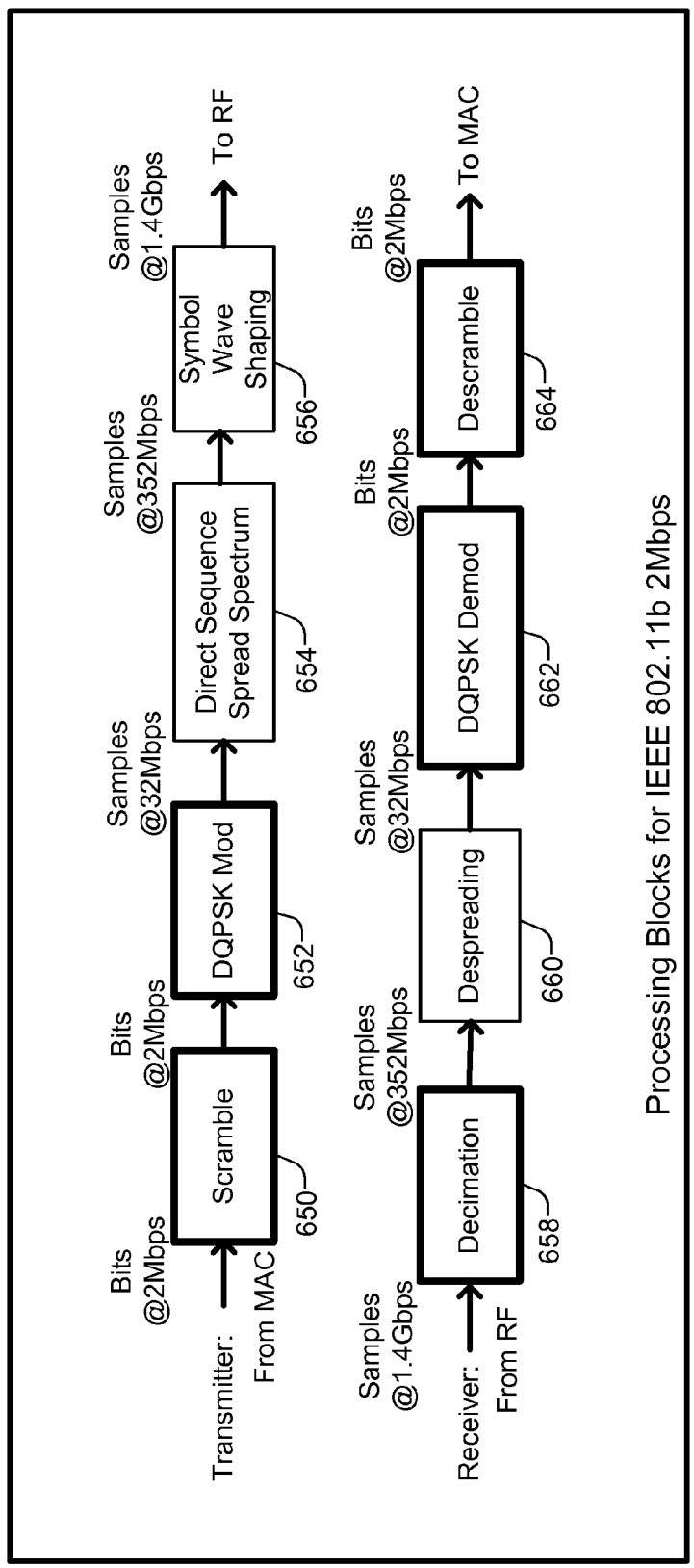
FIG. 6B illustrates optimized PHY blocks according to some implementations.

FIG. 6B illustrates an example of PHY operations for IEEE 802.11b at 2 Mbps, further showing examples of functional blocks that are optimized according to some implementations here, as discussed above with reference to FIG. 6A. The role of the PHY layer is to convert information bits into a radio waveform, or vice versa. As illustrated in FIG. 6B, at the transmitter side, the wireless PHY component first modulates the message (i.e., a packet or a MAC frame) into a time sequence of baseband signals. Baseband signals are then passed to the radio front end, where they are multiplied by a high frequency carrier and transmitted into the wireless channel. In the illustrated example, the data from the MAC goes to a scramble block 650, a DQPSK modulator block 652, a direct sequence spread spectrum block 654, a symbol wave shaping block 656, and then is passed to the RF front end. At the receiver side, the RF front end detects signals in the channel and extracts the baseband signal by removing the high-frequency carrier. The extracted baseband signal is then fed into the receiver's PHY layer to be demodulated into the original message. In the illustrated example, the signal from the RF front end is passed to a decimation block 658, a despreading block 660, a DQPSK demodulator block 662, a descramble block 664, and then to the MAC layer. Accordingly, advanced communication systems (e.g., IEEE 802.11a/b/g) contain multiple functional blocks in their PHY components. These functional blocks are pipelined with one another. Data is streamed through these blocks sequentially, but with different data types and sizes. For instance, as illustrated in FIG. 6B, different blocks may consume or produce different types of data at different rates arranged in small data blocks. For example, in 802.11b, as illustrated in FIG. 6B, the scrambler block 650 may consume and produce one bit, while DQPSK modulation block 652 maps each two-bit data block onto a complex symbol which uses two 16-bit numbers to represent the in-phase and quadrature (I/Q) components.

Each PHY block performs a fixed amount of computation on every transmitted or received bit. When the data rate is high, e.g., 11 Mbps for 802.11b and 54 Mbps for 802.11a/g, PHY processing blocks consume a significant amount of computational power. It is estimated that a direct implementation of 802.11b may require 10 Gops while 802.11a/g requires at least 40 Gops. These requirements are very demanding for software processing in GPPs.

PHY processing blocks directly operate on the digital waveforms after modulation on the transmitter side and before demodulation on the receiver side. Therefore, high-throughput interfaces are desired to connect these processing blocks as well as to connect the PHY with the radio front end. The required throughput linearly scales with the bandwidth of the baseband signal. For example, the channel bandwidth is 20 MHz in 802.11a. This requires a data rate of at least 20 Million complex samples per second to represent the waveform. These complex samples normally require 16-bit quantization for both I and Q components to provide sufficient fidelity, translating into 32 bits per sample, or 640 Mbps for the full 20 MHz channel. Over-sampling, a technique widely used for better performance, doubles the requirement to 1.28 Gbps to move data between the RF frond-end and PHY blocks for one 802.11a channel.

As discussed above with reference to FIG. 6A, in order to speed up processing of some blocks, implementations herein optimize certain functional blocks by using LUT and SIMD optimization techniques discussed above. In the illustrated example of FIG. 6B, as shown in bold, scramble block 650, descramble block 664, and DQPSK Modulator and DQPSK demodulator blocks 624 are optimized using LUTs stored in cache on the processor, corresponding to scramble algorithm 620, descramble algorithm 622, and mapping and spreading algorithm 624 discussed above with respect to FIG. 6A. Further, decimation block 658 is optimized using SIMD processor extensions corresponding to decimation algorithm 630 discussed above with respect to FIG. 6A.

Figure 6C:
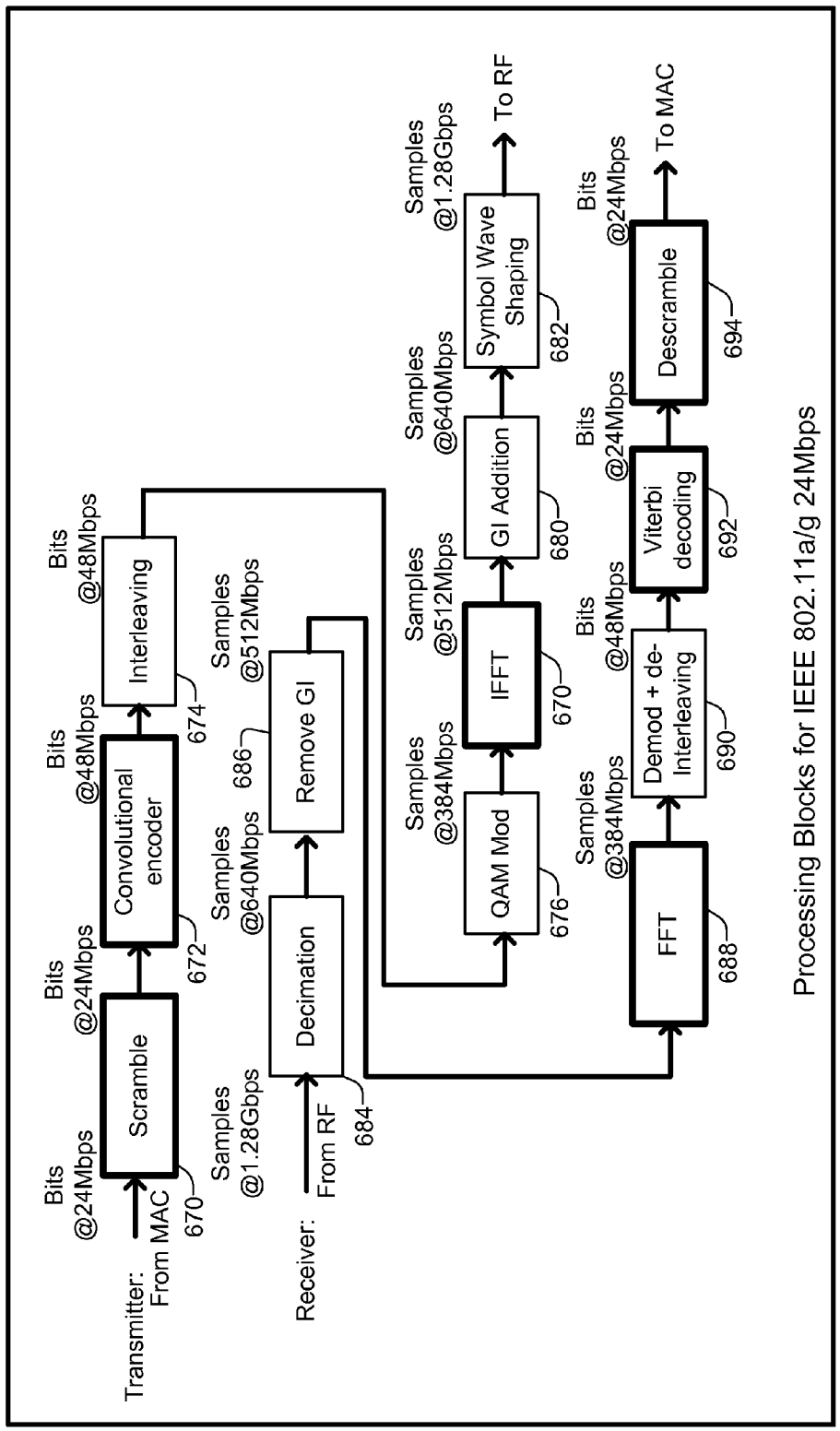
FIG. 6C illustrates optimized PHY blocks according to some implementations.

Similarly, FIG. 6C illustrates an example of PHY operations for IEEE 802.11a at 24 Mbps, showing in bold which functional blocks are optimized according to some implementations here, as discussed above with reference to FIG. 6A. On the transmitter side, the data received from the MAC layer is passed to a scramble block 670, convolutional encoder block 672, an interleaving block 674, a QAM modulator block 676, an IFFT block 670, a GI addition block 680, a symbol wave shaping block 682, and then is passed to the RF front end. On the receiver side, the signal from the RF front end is passed to a decimation block 684, a remove GI block 686, an FFT block 688, a demodulating and interleaving block 690, a Viterbi decoding block 692, a descramble block 694, and then to the MAC processing. In order to speed up processing of some blocks, implementations herein optimize certain blocks by using LUT and SIMD optimization techniques discussed above with respect to FIG. 6A. In the illustrated example of FIG. 6C, scramble block 670 and descramble block 694 are optimized using LUTs stored in cache on the processor corresponding to scramble and descramble algorithm 640 discussed above; FFT Block 688 and IFFT block 670 are optimized using SIMD processor extensions corresponding to FFT/IFFT algorithm 632 discussed above; convolutional encoder block 672 is optimized using LUTs corresponding to convolutional encoder algorithm 634 discussed above; and Viterbi decoding block 692 is optimized using both LUTs and SIMD processor extensions corresponding to Viterbi algorithm 636 discussed above. Furthermore, in addition to the optimizations illustrated in this example, other optimization opportunities may be apparent to those of skill in the art in light of the disclosure herein.

SIMD Example Based on Fir Filter

The following provides an example of how to use SSE instructions to optimize the implementation of a FIR (Finite Impulse Response) filter in implementations of the SDR herein, corresponding to FIR filter algorithm 628 discussed above with respect to FIG. 6A, with it being understood that the optimizations of the other algorithms, such as decimation 630, may be similarly implemented. FIR filters are widely used in various PHY layers. An n-tap FIR filter is defined as follows:

$$y[t] = \Sigma_{k=0}^{n-1} c_k * x[t-k],$$

where x are the input samples, y are the output samples, and $c_k$ are the filter coefficients. With SIMD instructions, it is possible to process multiple samples at the same time. For example, Intel SSE supports a 128-bit packed vector and each FIR sample takes 16 bits. Therefore, it is possible to perform m=8 calculations simultaneously. To facilitate SSE processing, the data layout in memory should be carefully designed.

Figure 7A:
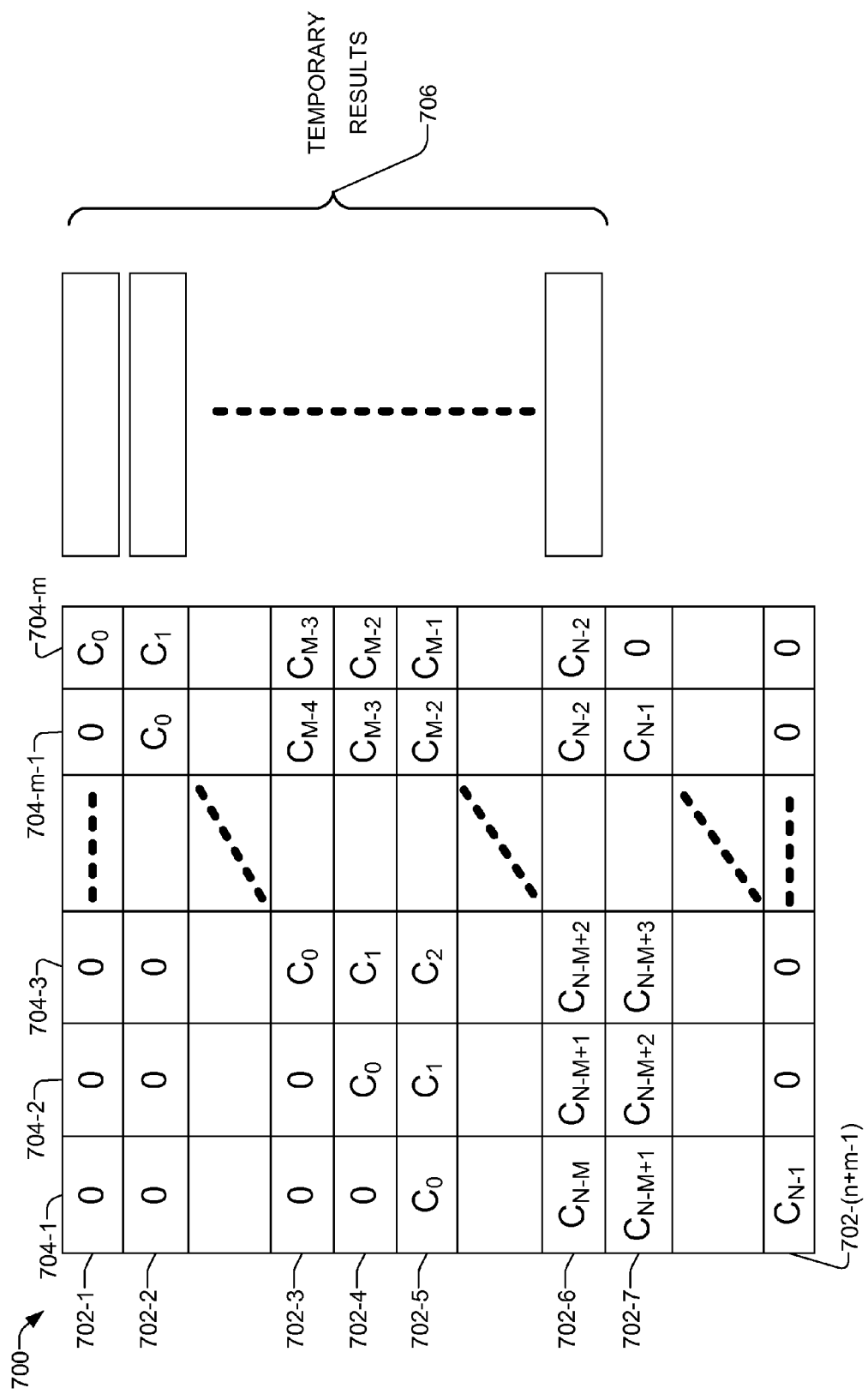
FIG. 7A illustrates an exemplary memory layout for SIMD (Single Instruction Multiple Data) processing according to some implementations.

FIG. 7A illustrates a memory layout 700 of the FIR coefficients according to implementations herein. Each row 702-1, . . . , 702-(n+m−1) forms a packed-vector containing m components for SIMD operations. The coefficient vector of the FIR filter is replicated in each column 704-1, . . . , 704-m in a zigzag layout. Thus, the total number of rows is (n+m−1). There are also n temporary variables 706 containing the accumulated sum up to each FIR tap for each sample.

Figure 7B:
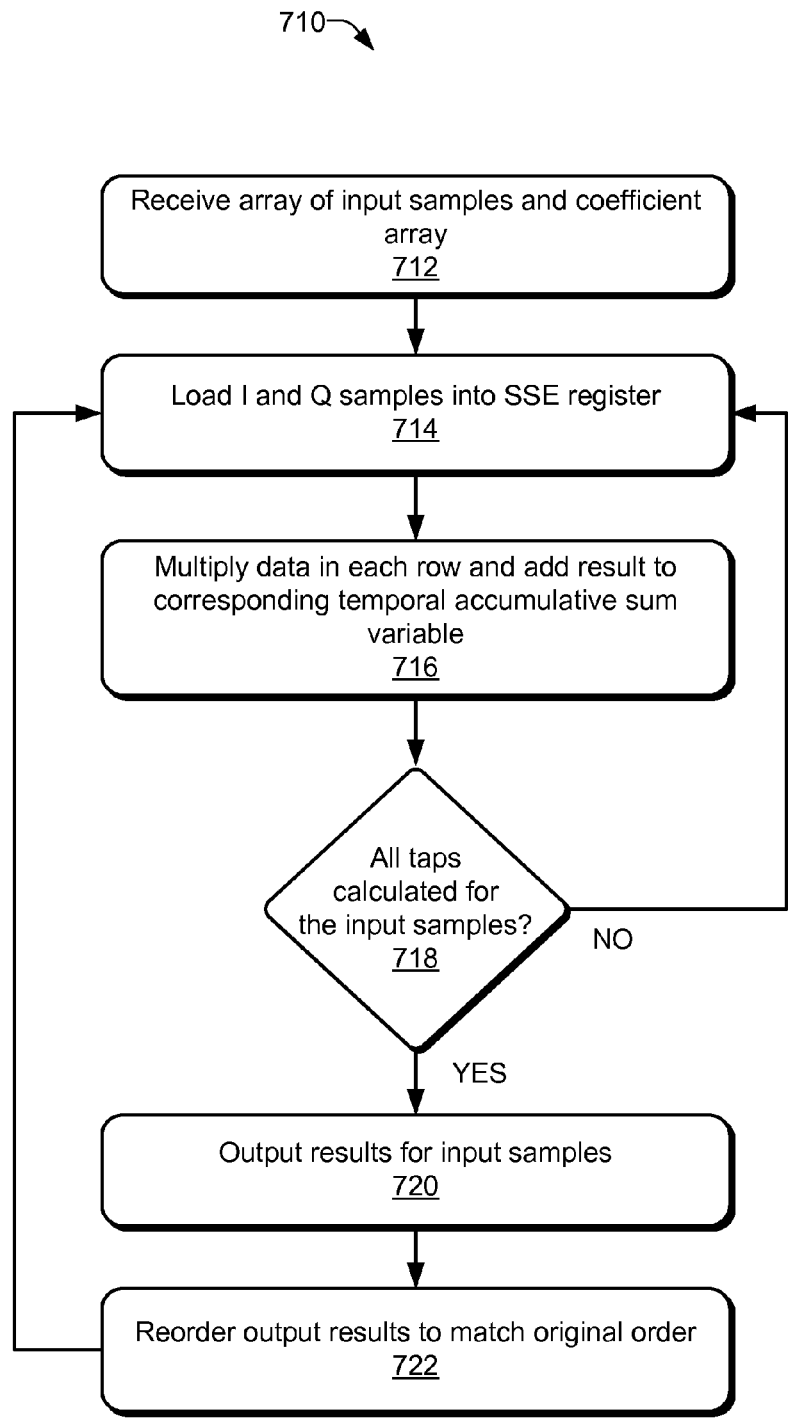
FIG. 7B illustrates a flowchart of an exemplary process for SIMD processing according to some implementations.

FIG. 7B illustrates a flowchart of an exemplary process for performing the SIMD operations of the FIR filter executed by the PHY layer of the SDR stack on a core of a multi-core processor. The process receives an array of input samples and a coefficient array, and outputs the filtered samples in an output sample buffer.

At block 712, the process receives an array of input samples and a coefficient array. The input samples contain two separate sample streams, with the even and odd indexed samples representing the I and Q samples, respectively. The coefficient array is arranged similarly to the layout of FIG. 7A, but with two sets of FIR coefficients for I and Q samples, respectively.

At block 714, for each iteration, four I and four Q samples are loaded into an SSE register.

At block 716, the process multiplies the data in each row and adds the result to the corresponding temporal accumulative sum variable.

At block 718, the process determines whether all the samples in the array of input samples have been processed to calculate all taps. If not, the process returns to block 714 to load more I and Q samples into the SSE registers.

At block 720, the results are output for the input samples when all taps have been calculated for the input samples. When the input sample stream is long, there are nm samples in the pipeline and m outputs are generated in each iteration. Note that the output samples may not be in the same order as the input samples. For example, some algorithms do not always require the output to have exactly the same order as the input.

Accordingly, at block 722, the output results can be reordered to the original order. This can be accomplished using a few shuffle instructions to place the output samples in original order, if needed. The process then returns to block 714 to continue to receive the stream of input samples from block 712 until all samples have been processed. Thus, while the foregoing provides a specific example of SIMD processing for speeding processing of digital samples in the SDR herein, it will be apparent to those of skill in the art in light of the disclosure herein that this process can be applied to optimize other SDR algorithms on one or more cores of a multi-core processor according to the implementations herein, such as the examples discussed above with respect to FIGS. 6A-6C.

High-Performance SDR Processing

Implementations of the SDR herein achieve high-performance SDR processing using software techniques that include efficient physical layer processing, multi-core streamline processing, and real-time support, each of which is described additionally below.

Convolutional Encoder Using LUT

In a memory-for-computation tradeoff, implementations of the SDR herein rely upon the large-capacity, high-speed cache memory in multi-core processors to accelerate PHY processing using pre-calculated LUTs stored in the PHY library. Contemporary processor architectures, such as Intel Core 2, usually have at least several megabytes of onboard cache with a low (e.g., 10~20 cycles) access latency. If LUTs are pre-calculated for a large portion of PHY algorithms and stored in the onboard cache for a corresponding core, this can greatly reduce the computational requirement for online processing and speed up overall processing time.

Figure 7C:
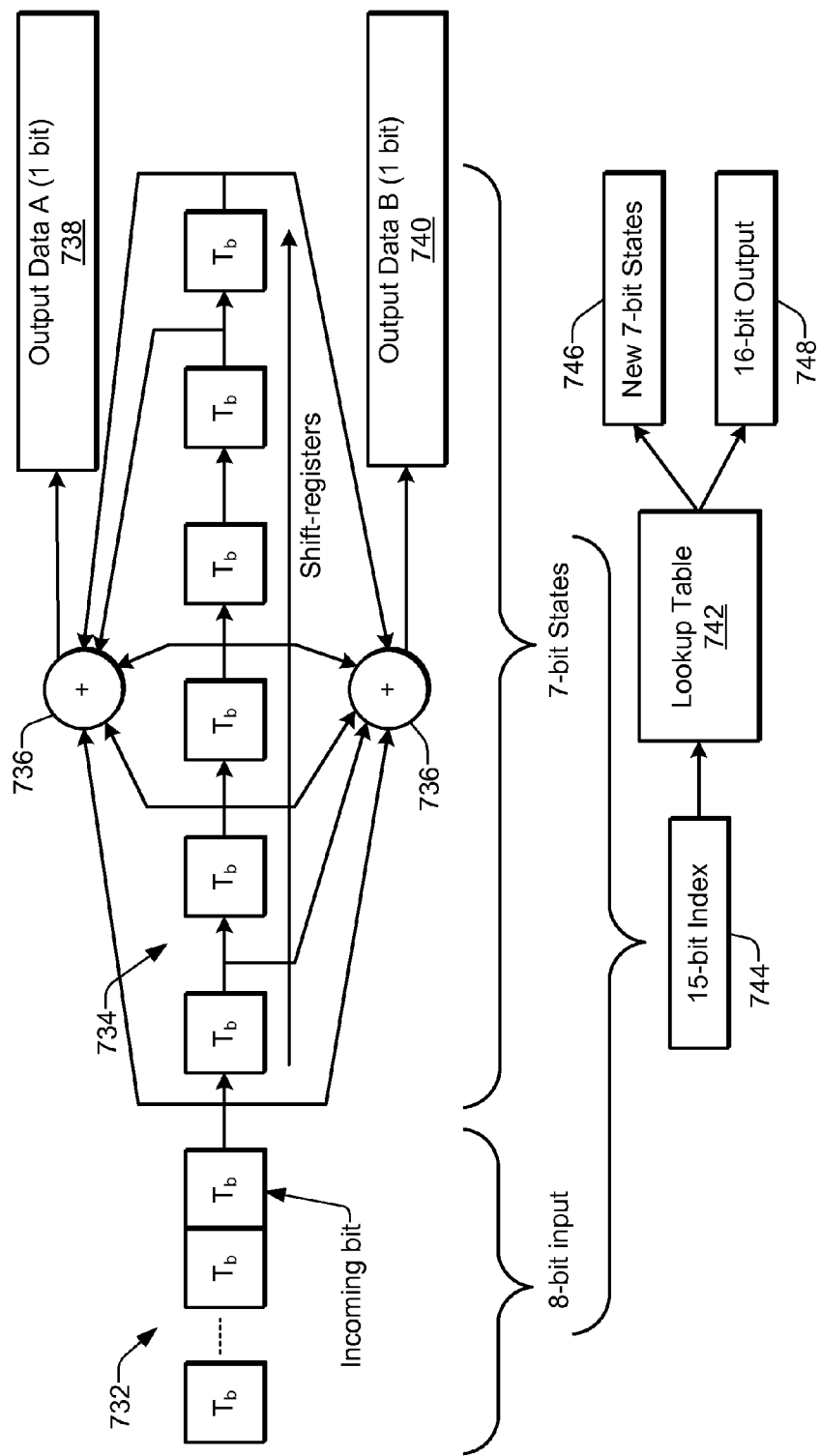
FIG. 7C illustrates an exemplary diagram showing processing using lookup tables according to some implementations.
Figure 7D:
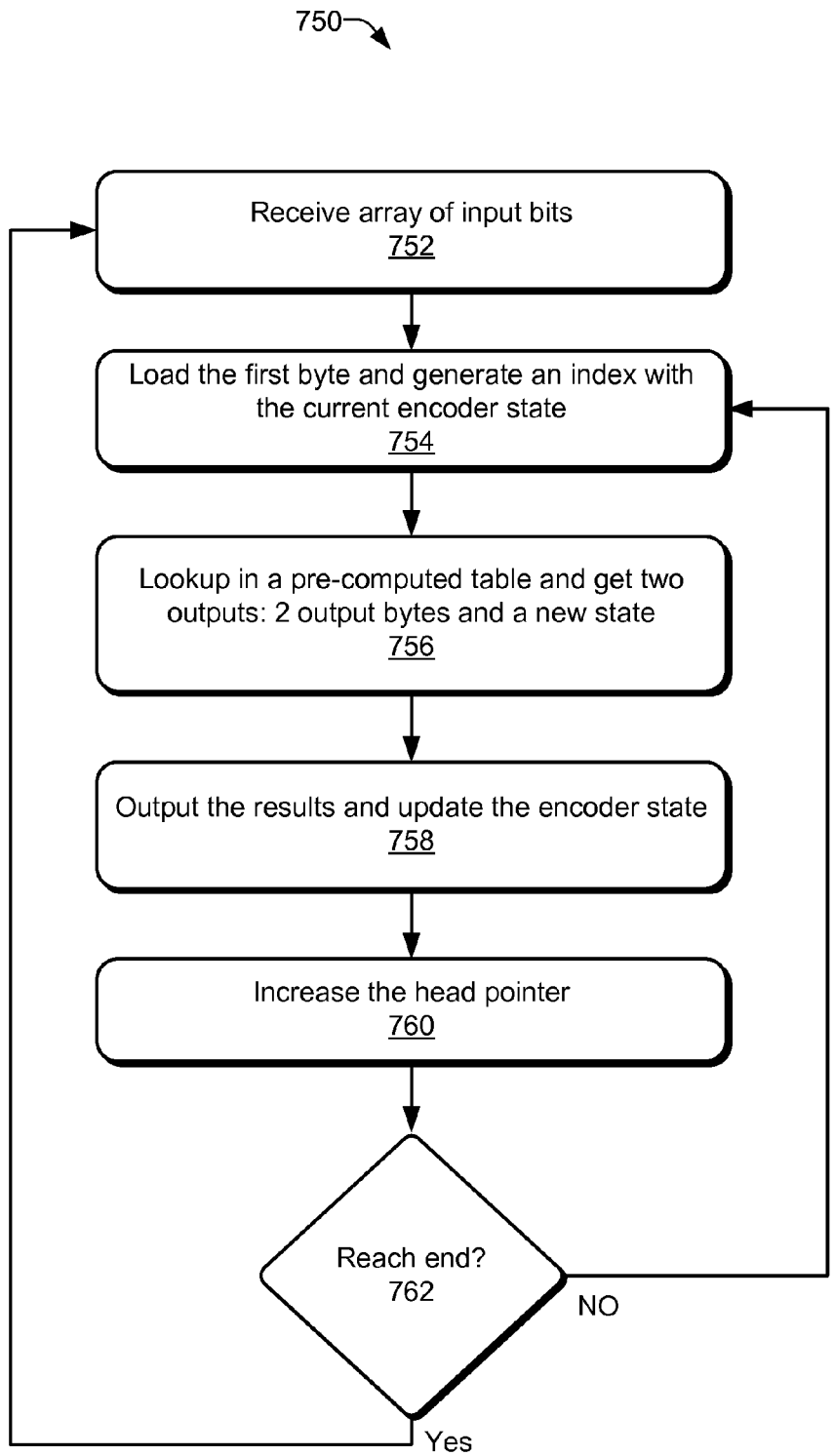
FIG. 7D illustrates a flowchart of an exemplary process using lookup tables according to some implementations.

FIGS. 7C-7D illustrate an example of SDR processing using a LUT according to some implementations herein. FIG. 7C illustrates how processing of a functional block can be speeded up by using a precomputed LUT instead of performing the actual processing of the bits using the processing algorithm. For example, when there are a finite combination of input bits and corresponding output data, then an LUT can be precomputed to be used to quickly match the input with corresponding output. In FIG. 7C, an array of input bits of a digital sample is received as a bit stream for processing, such as in one of the functional processing blocks described above with reference to FIGS. 6A-6C that is able to use an LUT to speed processing (e.g., the convolutional encoder algorithm). The convolutional encoder normally works in the following way. The convolutional encoder algorithm maintains seven shift registers 734, which form the state of the encoder. For each incoming bit, the algorithm 736 selects several bits in the shift registers 734 and performs eXclusive OR (XOR) operations on them, then two encoded output bits are generated as output data A 738 and output data B 740. Then, the shift registers 734 shift right and the input bit is put into the leftmost register. Conventionally, to process one bit, it takes eight operations to compute the outputs (i.e., to produce a 2-bit output from one bit input). However, as discussed above, the processing can avoid the actual processing of the algorithm 736 by using LUT 742. Thus, instead of processing one bit at a time, an 8-bit data can be a single input for processing using the LUT. The 8-bit input and the 7-bit states of the current state can be combined to generate a 15-bit index 744. The 15-bit index is then located in the LUT 742, and the corresponding precomputed new 7-bit states 746 and a 16-bit output 748 are determined from the LUT 742 instead of processing each bit individually by processing the algorithm 736. Thus, it may be seen that if all possible 15-bit indices and their corresponding output 7-bit states 746 and 16-bit outputs 748 are precomputed and stored in LUT 742, the actual processing time for the SDR sample stream can be greatly expedited (i.e., encoding of eight bits can be carried out using a single lookup operation).

FIG. 7D illustrates an exemplary process 750 that may be executed by the PHY layer of the SDR stack on a core of a multi-core processor by using an LUT instead of processing the bit stream using a conventional algorithm, such as the convolutional encoder algorithm. Other algorithms in the SDR pipeline may similarly be expedited by the use of precomputed LUTs, as discussed above with reference to FIGS. 6A-6C.

At block 752, an array of input sample bits is received for processing as a stream of bits.

At block 754, the process loads the first byte (8 bits) and generates an index with the current encoder state (the 7 bit state).

At block 756, the process accesses the precomputed LUT using the generated index and locates two values: two output bytes (i.e., a 16-bit output) and a 7-bit new state.

At block 758, the two output bytes are passed as output to the next processing block in the SDR processing stream, e.g., as illustrated in FIG. 6B or 6C, and the 7-bit new state is used for processing the next byte in the sample bit stream.

At block 760, the head pointer is increased to encompass the next eight bits.

At block 762, the process determines whether the end of the bit array has been reached. If not, the process returns to block 754 to process the next byte; if so, the process goes to block 752 to receive the next array of input bits.

As discussed above with reference to FIGS. 6A-6C, more than half of the common PHY algorithms of the IEEE 802.11 standards can be supplanted with LUTs, thereby resulting in a processing time speedup 614 from between approximately 1.5× to 50× (see, e.g., FIG. 6A). Since the size of each LUT is sufficiently small, the sum of all LUTs in a processing path can easily fit in the L2 caches of typical multi-core processor cores. Accordingly, when combined with core dedication, as discussed below, the possibility of cache collisions is very small. As a result, the LUTs of the implementations herein are almost always located in onboard caches during PHY processing. Additionally, while an exemplary implementation has been illustrated in FIGS. 7C-7D to describe how an LUT can be used to speed SDR processing, it should be understood that the other algorithms discussed above as being able to be expedited with LUTs can be similarly processed using precomputed LUTs.

Further, in order to accelerate PHY processing with data-level parallelism, implementations of the SDR herein also use the SIMD processor extensions discussed above, such as SSE, SEE2, 3DNow!®, and AltiVec® provided in conventional multi-core processors. Although these extensions were originally designed for multimedia and graphics applications, the extensions also match the needs of wireless signal processing very well because many PHY algorithms have fixed computation structures that can easily map to large vector operations. Measurements show that such SIMD extensions substantially speed up PHY processing in implementations of the SDR herein.

Turbo Encoder Using LUT

Figure 8:
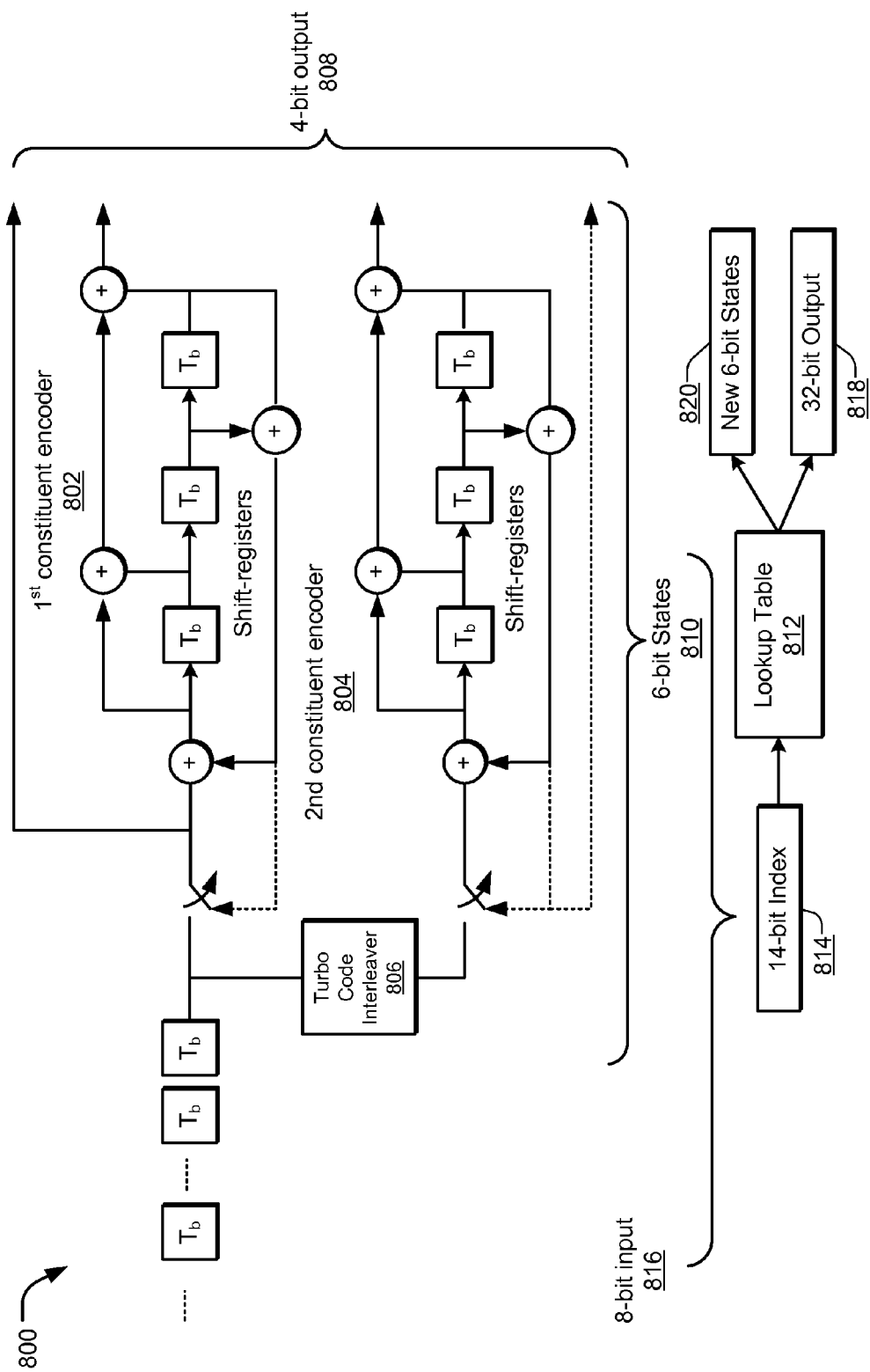
FIG. 8 illustrates an exemplary convolutional encoder.

FIG. 8 illustrates an exemplary implementation for Turbo encoder 800 using a look-up table (LUT) during encoding process. The Turbo encoder 800 can include two convolutional codes (e.g., $1^{st}$ constituent encoder 802 and $2^{nd}$ constituent encoder 804) in parallel with an interleaving (e.g., turbo code interleaving 806) in-between the two convolutional codes. The $1^{st}$ constituent encoder 802 and the $2^{nd}$ constituent encoder 804 can be used to encode continuous stream of data in finite blocks, which correspond to the turbo code interleaving 806 size. The finite block can be processed using the LUT as further discussed below.

Conventionally, each bit in the block can be serially inserted and processed by the $1^{st}$ constituent encoder 802 and the $2^{nd}$ constituent encoder 804 to provide a 4-bit output 808. The $1^{st}$ constituent encoder 802 and the $2^{nd}$ constituent encoder 804 include an algorithm that combines and processes existing 6-bit states 810 with the inserted bit in the (bit) block. At the end of multiple clock cycles, the 4-bit output 808 for the Turbo encoder 800 can provide the codes for a given sequence of bits in the bit block. In other implementations, the Turbo encoder 800 can be forced into a known state (i.e., frames can be terminated) after processing of the finite block. The known state (i.e., termination tail) is then appended to the 4-bit output 808 (of the Turbo encoder 800) to be used in a decoder.

In an implementation, a LUT 812 is used to predefine a 14-bit index 814 that can be used as an input to the Turbo encoder 800. The 14-bit index 814 can include an 8-bit input 816 (from the bit block) and the 6-bit states 810. For the 14-bit index 814, the LUT 812 can provide a 32-bit output 818 and new 6-bit states 820. The new 6-bit states 820 can be used to process the next byte of data (i.e., next 8 bits) in the bit block.

Figure 9:
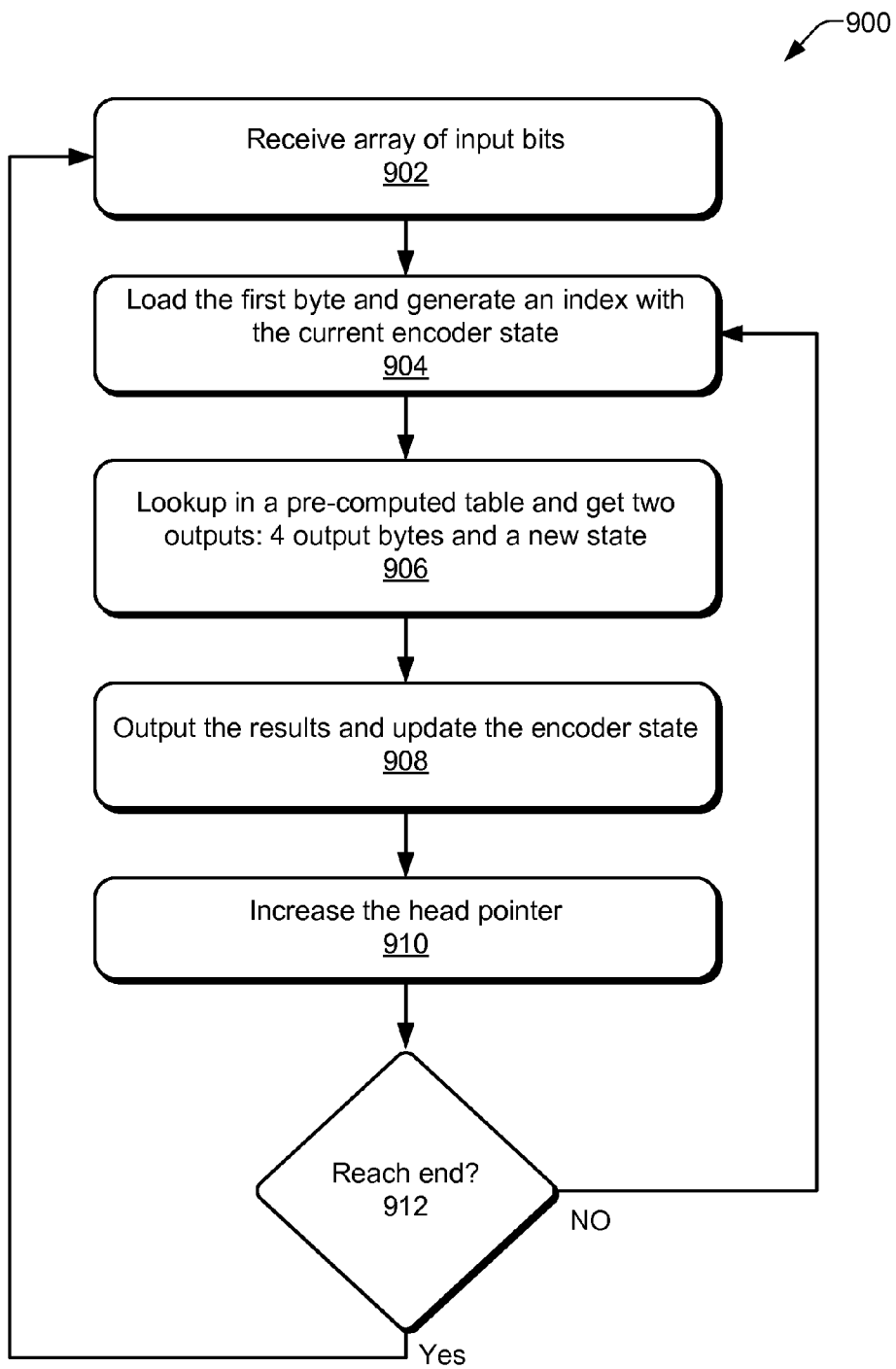
FIG. 9 illustrates a flowchart of an exemplary process using lookup tables according to some implementations.

FIG. 9 is a flow chart diagram 900 for an exemplary process for using LUT during encoding process. The order in which the method is described is not intended to be construed as a limitation, and any number of the described method blocks can be combined in any order to implement the method, or alternate method. Additionally, individual blocks can be deleted from the method without departing from the spirit and scope of the subject matter described herein. Furthermore, the method can be implemented in any suitable hardware, software, firmware, or a combination thereof, without departing from the scope of the invention.

At block 902, receiving an array of input bits is performed. In an implementation, the array of input bits includes finite blocks (i.e., bit blocks).

At block 904, the process loads the first byte (8 bits) and generates an index with the current encoder state. In an implementation, the current encoder state (6-bit states 810) is combined with 8-bit input 816 to generate a 14-bit index 814.

At block 906, the process accesses the precomputed LUT (i.e., LUT 812) using the generated index (i.e., 14-bit index 814) and locates two values: four output bytes (i.e., a 32-bit output 818) and a new 6-bit state (i.e., new 6-bit states 820).

At block 908, the four output bytes are passed as output to the next processing block in the SDR processing stream, e.g., as illustrated in FIG. 6B or 6C, and the 6-bit new state 820 is used for processing the next byte in the sample bit stream.

At block 910, the head pointer is increased to encompass the next eight bits.

At block 912, the process determines whether the end of the bit array (i.e., bit block) has been reached. If not, the process returns to block 904 to process the next byte; if so, the process goes to block 902 to receive the next array of input bits (i.e., bit block).

Spread Modulation Using LUT

Figure 10:
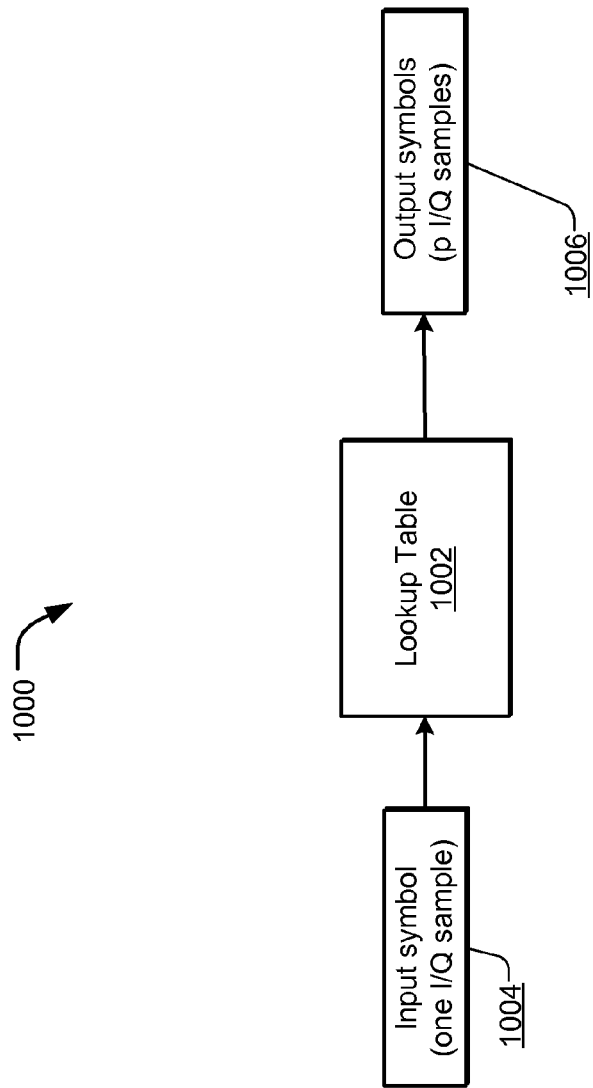
FIG. 10 illustrates an exemplary spread modulation using a look up table.

FIG. 10 illustrates an exemplary diagram 1000 for spread modulation in the QAM modulator 676 of FIG. 6C. The spread (spectrum) modulation includes a modulation technique that can secure communications through spreading of a signal over a large frequency band. In an implementation, a pseudo-random noise (PN) is added to the modulating signal to provide a uniform frequency distribution in the large frequency band. The PN can further provide greater bandwidth than a modulating signal bandwidth; however, power used during transmission of signal can remain the same.

In an implementation, in a direct sequence spreading modulation, a sequence of signal samples (or symbols) can be multiplied by PN values (e.g., 1, −1) at a relatively higher frequency signal to spread energy of the modulating data streams into the large frequency band. The multiplication can be derived from an algorithm that can be implemented by the direct sequence spreading modulation. As a result, a modulated signal can include sequence of symbols that are multiplied with a high frequency spreading signal (i.e., PN values) before transmission. At the receiving end, the algorithm implemented by the direct sequence spreading modulation (e.g., multiplication of the PN values) can be adopted for proper demodulation.

Since the spreading sequence is pre-defined and the all possible modulated signals are also pre-defined, a LUT 1002 can be used to map information bits directly to the spread signal sequence. In an implementation, the LUT 1002 includes an input symbol 1004, which contains separate samples for the I and Q components. The LUT 1002 further includes output symbols 1006, which contain "p" samples for the I and Q components. The output symbols 1106 can represent precomputed outputs (or values) for the all possible modulated signals to be transmitted.

Decoder Using SIMD Instructions

Figure 11:
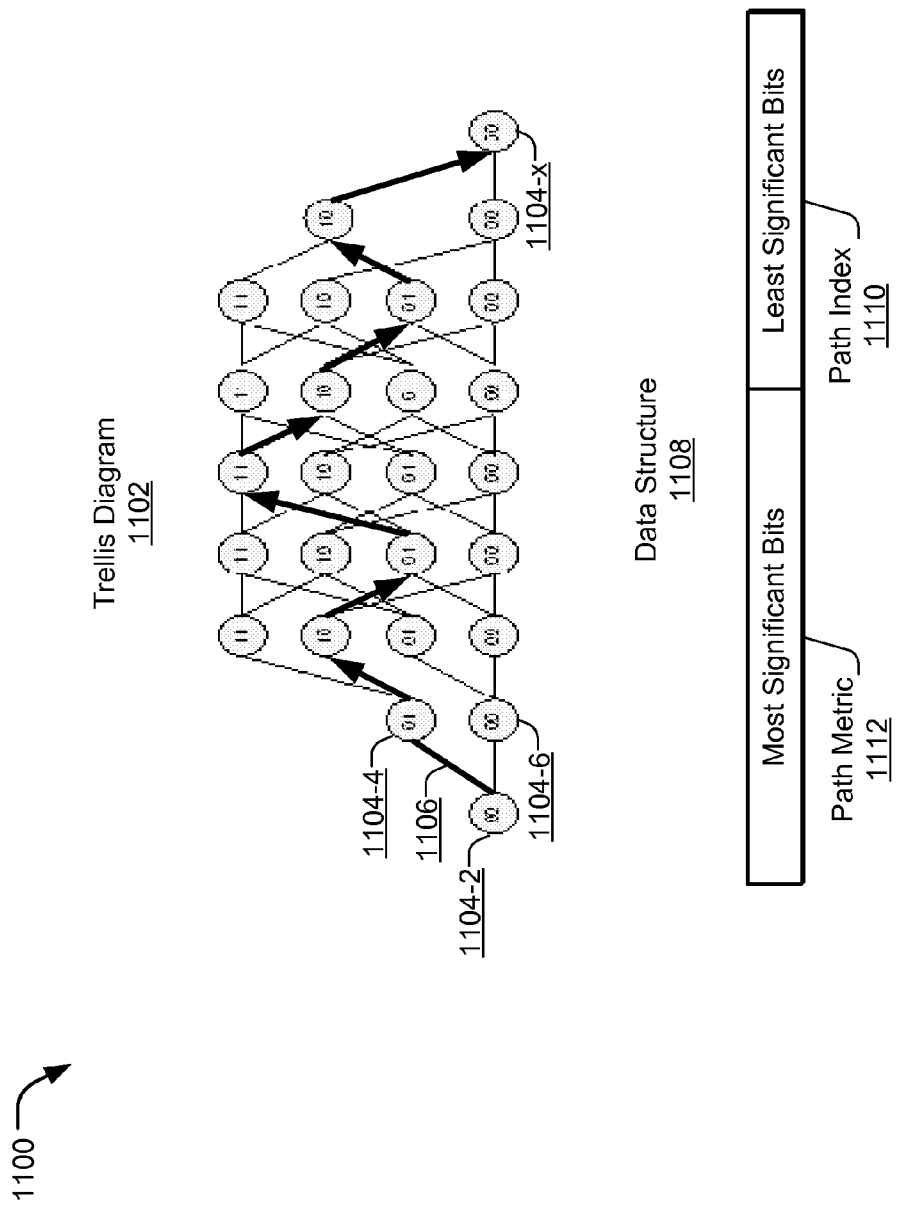
FIG. 11 illustrates an exemplary decoder according to some implementations.

FIG. 11 illustrates an exemplary processing diagram 1100 for a decoder, such as, Viterbi decoding 692 in FIG. 6C (for IEEE 802.11a/g). As discussed above, the Viterbi decoding 692 (or Viterbi 636 in FIG. 6A) may include a Viterbi algorithm, such as, the Viterbi Algorithm 636 (of FIG. 6A) that uses the LUT and the SIMD for optimization method. In an implementation, the Viterbi algorithm can be used as a dynamic programming method to find the best solution for a problem, such as, searching for an optimal path (or shortest path) in a Trellis diagram 1102. The optimal path or the shortest path in the Trellis diagram 1102 can be used to decode convolutional codes or block codes that were encoded at a transmitting side. In other implementations, an array of input data bits to the Viterbi decoding 692 includes hard codes (i.e., smallest hamming distance or bit disagreement is observed) or one or more soft values (i.e., bits were derived through best correlation).

The trellis diagram 1102 can be used to derive a correct sequence of demodulated baseband signals from demodulator and de-interleaving block 690 of FIG. 6C. The correct sequence can be determined by finding the optimal path (or shortest path) in the trellis diagram 1102 based on the demodulated baseband signals. In other implementations, for maximum likelihood sequence detection, the optimal path (or the shortest path) is the most probable encoded data streams (i.e., baseband signals) in the convolutional encoder 672 of FIG. 6C.

During decoding, the Trellis diagram 1102 is expanded with each stage (at every clock cycle) of the array or sequence of data bits received from the demodulator and de-interleaving block 690. The Trellis diagram 1102 can start with a known state in circle 1104-2 (i.e., zero state). Circles 1104-4, 1104-6, to 1104-$x$ can include all possible states in the Trellis diagram 1102 for subsequent clock cycles after the starting state (i.e., zero state). In an implementation, for the sequence of data bits from the demodulator and de-interleaving block 690, the Trellis diagram 1102 expands to a new stage relative to the initial state in the circle 1104-2. A solid line 1106 can represent the possible transitions from one state to another state based on the input information (i.e., sequence of data bits). At the end of the Trellis diagram 1102 (i.e., circle 1104-$x$), a trace back procedure (for the solid line 1106) can be performed to define the actual codes encoded (in the convolutional encoder 672 of FIG. 6C). In other implementations, a path metric (e.g., the probability of the incoming bit) is associated with each line (in the solid line 1106), and each state—at each stage—records a minimal path metric sum for all paths that reach that state.

The output of the algorithm in the Trellis diagram 1102 can provide the path with the shortest path metric. To find the path with the shortest path metric, the Viterbi algorithm can include add-compare-select (ACS) operations to arrive at the path metric as shown in the solid line 1106. As discussed above, the path metric is associated and/or linked with each line in the solid line 1106. The link for the path metric should be recorded and/or stored into memory. To this end, the trace back procedure can be used to define the paths that were traversed during expansion to the new stage for every incoming data bit, such as, the sequence of data bits described above. In other implementations, the trace back procedure is required to store the path metric for every expanded stage relative to the incoming data bits for determining the shortest path at the end of Trellis expanding.

In an implementation, a major optimization for the Viterbi decoding 692 is to make use of a "min" operation during the ACS operation to select the path with the shortest path metric. The "min" operation can be executed by a processor (e.g., processors 102) that executes the SIMD instructions. To find the minimal path (i.e., shortest path), the "min" operation can require one operation instead of multiple comparison instructions used in the conventional processing; however, the "min" operation generally gives only the minimal metric value but not link leads to that minimal metric value. To this end, a data structure 1108 can be introduced to provide the link to the minimal metric value during the "min" operation.

In an implementation, the data structure 1108 includes a path index 1110 that is embedded in least significant bits of the data structure 1108, and a path metric 1112 that is embedded in most significant bits of the data structure 1108. When performing the ACS operation in the Trellis diagram 1102, the path metric 1112 is updated to provide the (shortest) link to each state (e.g., circle 1104-4) in the Trellis diagram 1102. In addition, the path index 1110 is further updated to contain link information for the shortest link defined by the path metric 1112. The link information can be used during the trace back to find the optimal path (e.g., solid lines 1106) by simply checking the path index 1110 that are associated with the path metric 1112. The optimal path can be the output algorithm for the Viterbi decoding 692.

Figure 12:
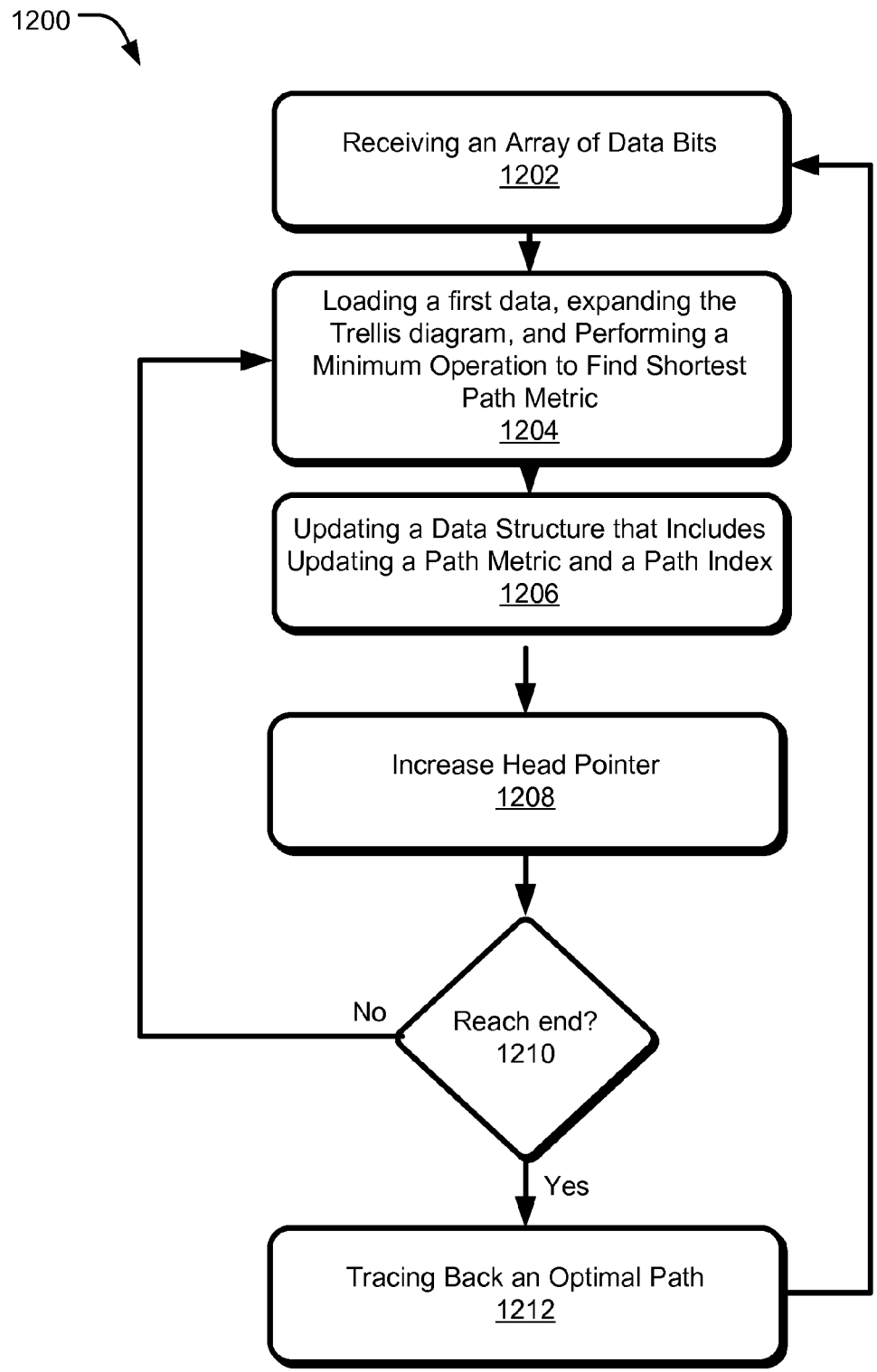
FIG. 12 illustrates a flowchart of an exemplary process using lookup tables according to some implementations.

FIG. 12 is a flow chart diagram 1200 for an exemplary process for finding an algorithm output for Viterbi decoding 692. The order in which the method is described is not intended to be construed as a limitation, and any number of the described method blocks can be combined in any order to implement the method, or alternate method. Additionally, individual blocks can be deleted from the method without departing from the spirit and scope of the subject matter described herein. Furthermore, the method can be implemented in any suitable hardware, software, firmware, or a combination thereof, without departing from the scope of the invention.

At block 1202, receiving an array or sequence of data bits is performed. In an implementation, the sequence of data bits includes demodulated signals from a demodulator and de-interleaving block (e.g., demodulator and interleaving block 690 of FIG. 6C). Depending upon a size of a Trellis diagram (e.g., Trellis diagram 1102), the array of (input) data bits can be truncated (e.g., 1 byte at one clock cycle) for processing.

At block 1204, loading a first data (e.g. a byte) and expanding the Trellis diagram 1102 is performed. In an implementation, all possible new states are packed into several (e.g., four in 802.11a) data vectors and SIMD instructions are used to compute new path metric for each possible path. Afterwards, a "min" operation on the new path metrics is performed to find the minimal path as well as the link that leads path (with embedded path index).

At block 1206, updating a data structure is performed. In an implementation, the "min" operation for each expansion in the Trellis diagram 1102 results to an updated path metric (e.g., path metric 1112) that defines the shortest path link for the expansion, and path index (e.g., path index 1110) that defines and/or stores the link for the path metric 1112.

At block 1208, the head pointer is increased to encompass the next eight bits.

At block 1210, determining whether end of the sequence of data bits has been reached. If not, the process returns to block 1204 to process the next byte. If the sequence of data bits has been reached, the process goes to block 1212 to perform a trace back in the Trellis diagram 1102.

At block 1212, tracing back an optimal path is performed. In an implementation, an optimal path (e.g., solid line 1106) can be traced back by simply checking the stored path index 1110 for each expansion in the Trellis diagram 1102. In other implementation, the solid line 1106 is the output algorithm for the Viterbi decoding 692. After the tracing back is performed, the process can go back to block 1202 to process another array or sequence of data bits.

Soft Demapper Using LUT

Figure 13:
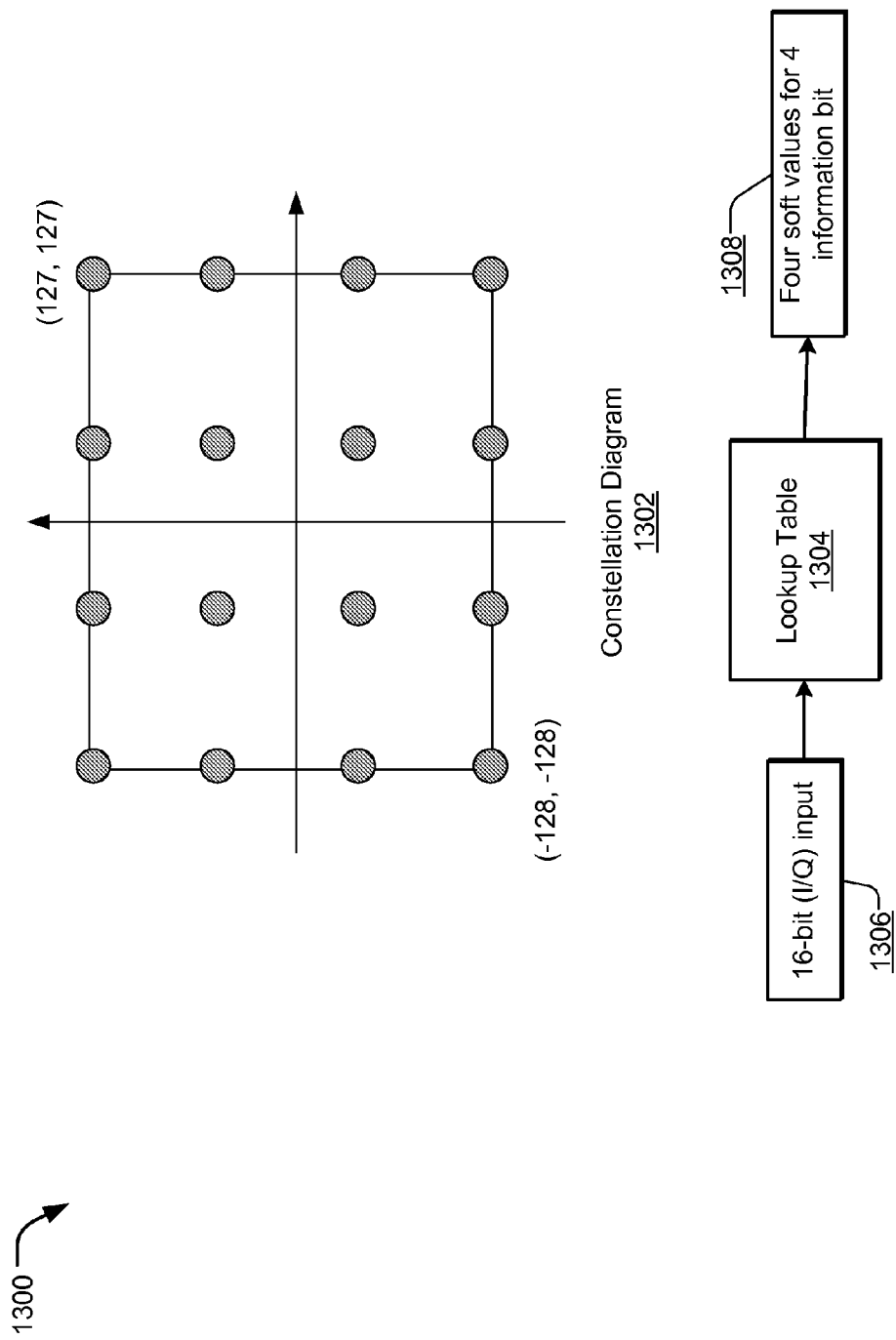
FIG. 13 illustrates an exemplary soft demapper using a look up table

FIG. 13 illustrates an exemplary processing block 1300 for a soft-demapper. As shown in FIG. 6A, the soft demapper 638 used for demodulation in the IEEE 802.11a standard needs to calculate the confidence level of each bit contained in an incoming symbol. This task involves rather complex computations proportional to the modulation density. More precisely, the soft demapper 638 conducts an extensive search for all modulation points in a constellation graph and calculates a ratio between the minimum of Euclidean distances to all points representing one and the minimum of distances to all points representing zero. In implementations of the SDR herein, the confidence levels for all possible incoming symbols are pre-calculated based on their I and Q values, and LUTs are built to directly map the input symbol to confidence level. Such LUTs need not be large. For example, as shown in constellation diagram 1302, all possible inputs for I and Q value may be limited between −128 to 127. Thus, it requires 64K entries at most for Soft-Demapper. Actually, by exploiting symmetry, in 802.11a/g with a 54 Mbps modulation rate (64-QAM), the size of the LUT for the soft demapper 638 is about 1.5 KB.

Conventionally, a processing of demapper functions requires significant computational power to provide the confidence levels of the received symbols. In an implementation, as an optimization method for the soft-demapper computing, a LUT 1304 predefines the computed values for demapper functions that provide soft-values for the I and Q components of the received symbols. The received symbol is first quantize into 16-bit, with 8-bit for 1 (in-phase) and 8-bit for Q (quadrature-phase) components (i.e., 16-bit I/Q input 1306). In 802.11a/g standard, an approximation of the soft-value includes a sum of the soft value for 1 and Q, which are computed independently. To this end, an 8-bit index LUT can be built instead of 16-bit table. In addition, the computation of the soft-value for the I and Q component are identical such that, the I and Q can share the same LUT 1304. An output 1308 may include four soft values for four information bits (i.e., 16-bit I/Q pair 1306).

Figure 14:
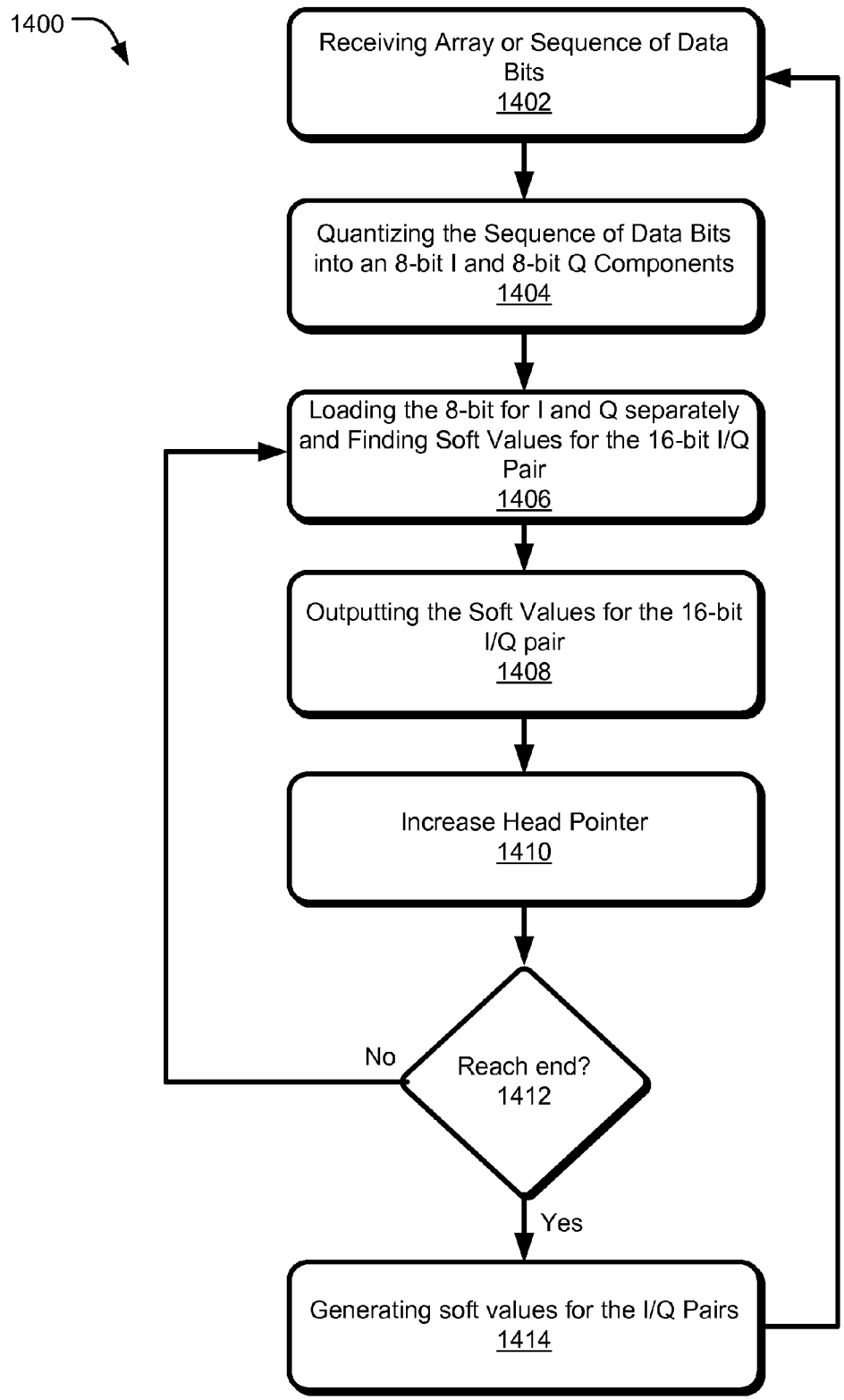
FIG. 14 illustrates a flowchart of an exemplary process using lookup tables according to some implementations.

FIG. 14 is a flow chart diagram 1400 for an exemplary process for generating soft values for received symbols in a soft demapper 638. The order in which the method is described is not intended to be construed as a limitation, and any number of the described method blocks can be combined in any order to implement the method, or alternate method. Additionally, individual blocks can be deleted from the method without departing from the spirit and scope of the subject matter described herein. Furthermore, the method can be implemented in any suitable hardware, software, firmware, or a combination thereof, without departing from the scope of the invention.

At block 1402, receiving an array or sequence of data bits is performed. In an implementation, the sequence of data bits include received symbols from the FFT 688 in FIG. 6C.

At block 1404, quantizing the received symbols into 16-bit is performed. In an implementation, the 16-bit includes an 8-bit for the I component and another 8-bit for the Q component.

At block 1406, loading the 16-bit for the I/Q pair is performed. In an implementation, the 16-bit I/Q pair input (e.g., 16 bit I/Q input 1306) uses an 8-bit LUT (e.g., 8-bit LUT 1304) to output four soft values for four information bits (e.g., output 1308).

At block 1408, outputting the soft values for the 16-bit I/Q pair is performed.

At block 1410, the head pointer is increased to encompass the next eight bits.

At block 1412, determining whether end of the quantized sequence of data bits has been reached. If not, the process returns to block 1406 to process the next byte. If the quantized sequence of data bits has been reached, the process goes to block 1414 to generate soft values for the I and Q components.

At block 1414, generating the soft value for the I and Q components is performed.

Multi-Core Streamline Processing

Even with the above optimizations, a single CPU core may not have sufficient processing capacity to meet the processing requirements of high-speed wireless communication technologies. As a result, implementations of the SDR herein are able to use more than one core in a multi-core processor for PHY processing. In some implementations, the multi-core technique is also scalable to provide for compatibility with increasingly more complex signal processing algorithms as wireless technologies progress.

As discussed above, such as with respect to FIGS. 6B and 6C, physical layer processing typically contains a number of functional blocks or distinct stages in a pipeline. These blocks differ in processing speed and in input/output data rates and units. A block is only ready to execute when the block has received sufficient input data from the preceding block. Therefore, a key issue is how to schedule a functional block on multiple cores when the block is ready for processing.

Figure 15A:
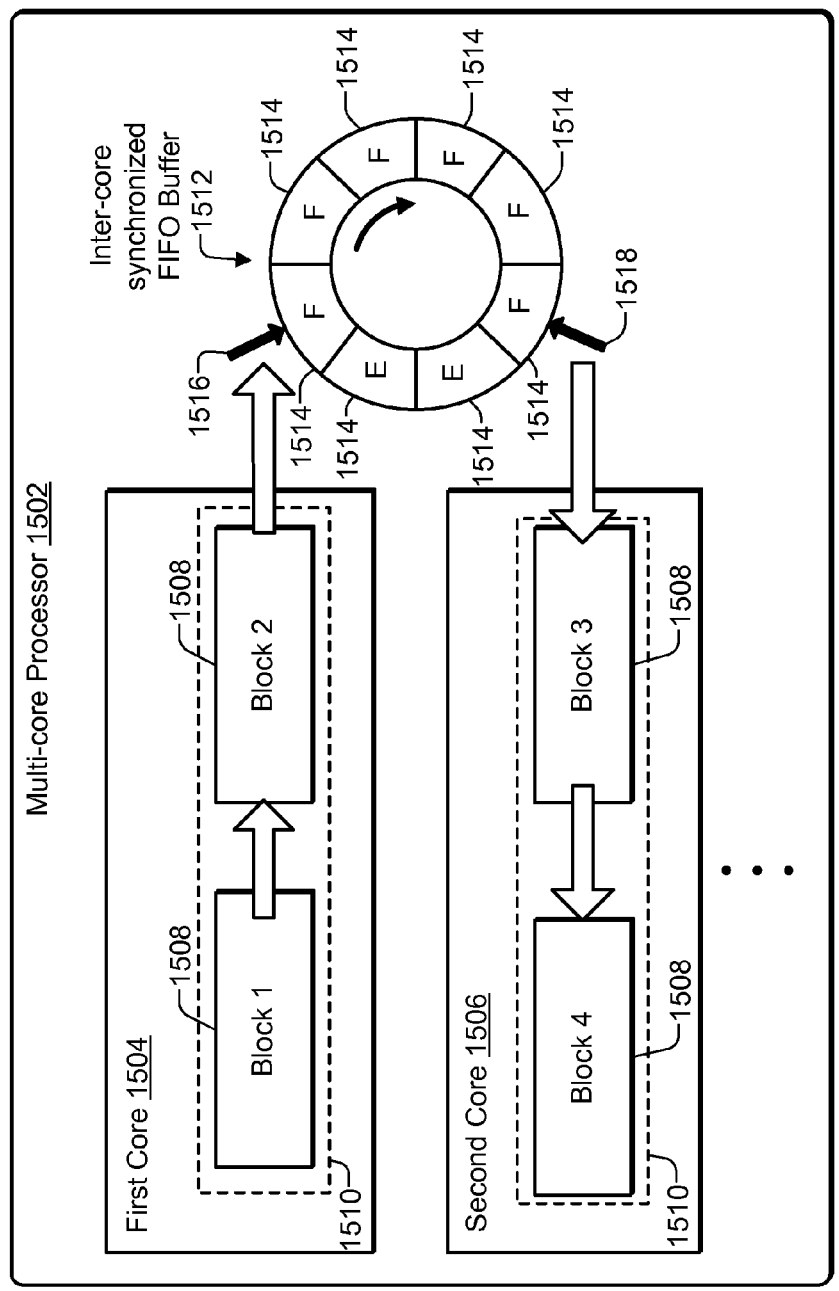
FIG. 15A illustrates an exemplary synchronized First-In-First-Out (FIFO) buffer according to some implementations.

FIG. 15A illustrates an exemplary implementation for processing data in functional blocks on different cores in a multi-core processor 1502, which may correspond to multi-core processors 102, 202 discussed above. For example a first core 1504 and a second core 1506 may be used to process the functional blocks discussed above with reference to FIGS. 6A-6C. First core 1504 may be located on the same multi-core processor as second core 1506, or the cores 1504, 1506 may be located on separate processors.

In FIG. 15A, the first core 1504 and the second core 1506 process a plurality of functional blocks 1508 using a static scheduling scheme. This implementation is based on the observation that the schedule of each block in a PHY processing pipeline is actually static, i.e., the processing pattern of previous blocks can determine whether a subsequent block is ready or not. Implementations of the SDR herein can thus partition the whole PHY processing pipeline into several sub-pipelines 1510 and statically assign the sub-pipelines 1510 to different cores 1504, 1506. Within one sub-pipeline 1510, when a first block 1508 has accumulated enough data for the next block to be ready, the first block explicitly schedules the next block. Adjacent sub-pipelines from different blocks are connected with a synchronized FIFO 1512 that manages the delivery of data between the sub-pipelines 1510. For example, the synchronized FIFO 1512 may be established in one of caches 106, 108 discussed above with respect to FIG. 1. Thus, implementations herein allow different PHY processing blocks 1508 to streamline across multiple cores 1504, 1506 while communicating with one another through one or more shared memory synchronized FIFO queues. For example, if two blocks 1508 (e.g., Block 2 and Block 3 of FIG. 15A) are running on different cores 1504, 1506, their access to the shared FIFO 1512 must be synchronized. The traditional implementation of a synchronized FIFO uses a counter to synchronize the writer (producer) and reader (consumer) in what is referred to as a counter-based FIFO (CBFIFO).

However, this counter is shared by two processor cores, and every write to the variable by one core will cause a cache miss on the other core. Since both the producer and consumer modify this variable, two cache misses are unavoidable for each datum. It is also quite common to have very fine data granularity in PHY (e.g., 4-16 bytes as summarized in FIG. 6 discussed above). Therefore, such cache misses will result in significant overhead when synchronization has to be performed very frequently (e.g., once per microsecond) for such small pieces of data. In implementations of the SDR herein, an inter-core synchronized circular FIFO buffer 1512 is implemented that does not use a shared synchronization variable. Instead of having a shared variable, implementations herein augment each data slot 1514 in the synchronized FIFO buffer 1512 with a header that indicates whether the slot is empty or full (i.e., "E" or "F"). Furthermore, each data slot 1514 is padded to be a size that is equal to a multiple of a cache line size. Thus, the consumer is always chasing the producer in the circular buffer 1512 for filled slots, as outlined in the following pseudo code:

```
// Producer:
void write_fifo ( DATA_TYPE data ) {
    while (q[w_tail].flag>0); // spin wait
    q[w_tail].data = data;
    q[w_tail].flag = 1; // occupied
```

```
w_tail = (w_tail+1) % q_size;
}
// Consumer:
void read_fifo ( DATA_TYPE * pdata ) {
    while (q[r_head].flag==0); // spin
    *data = q[r_head].data;
    q[r_head].flag = 0; // release
    r_head = (r_head + 1) % q_size;
}
```

This chasing-pointer FIFO (CPFIFO) largely mitigates the overhead even for very fine-grained synchronization through implementation of a producer pointer 1516 and a consumer pointer 1518. For example, if the speed of the producer (e.g., Block 2 on first core 1504) and consumer (e.g., Block 3 on second core 1506) is the same, and the two pointers are separated by a particular offset (e.g., two cache lines in the Intel architecture), no cache miss will occur during synchronized streaming since the local cache will pre-fetch the following slots before the actual access. If the producer and the consumer have different processing speeds, e.g., the consumer (reader) is faster than the producer (writer), then eventually the consumer will wait for the producer to release a slot. In this case, each time the producer writes to a slot, the write will cause a cache miss at the consumer. However, the producer will not suffer a miss since the next free slot will be prefetched into its local cache. Further, the cache misses experienced by the consumer will not cause significant impact on the overall performance of the streamline processing since the consumer is not the bottleneck element. Additionally, while the FIFO buffer 1512 is illustrated as being circular, it is understood in the art that this is only for illustration purposes and that the buffer is actually a logical location in the cache memory and that the locations of the empty and full data slots in the buffer 1512 are actually maintained by the relative locations of the pointers 1516, 1518.

Figure 15B:
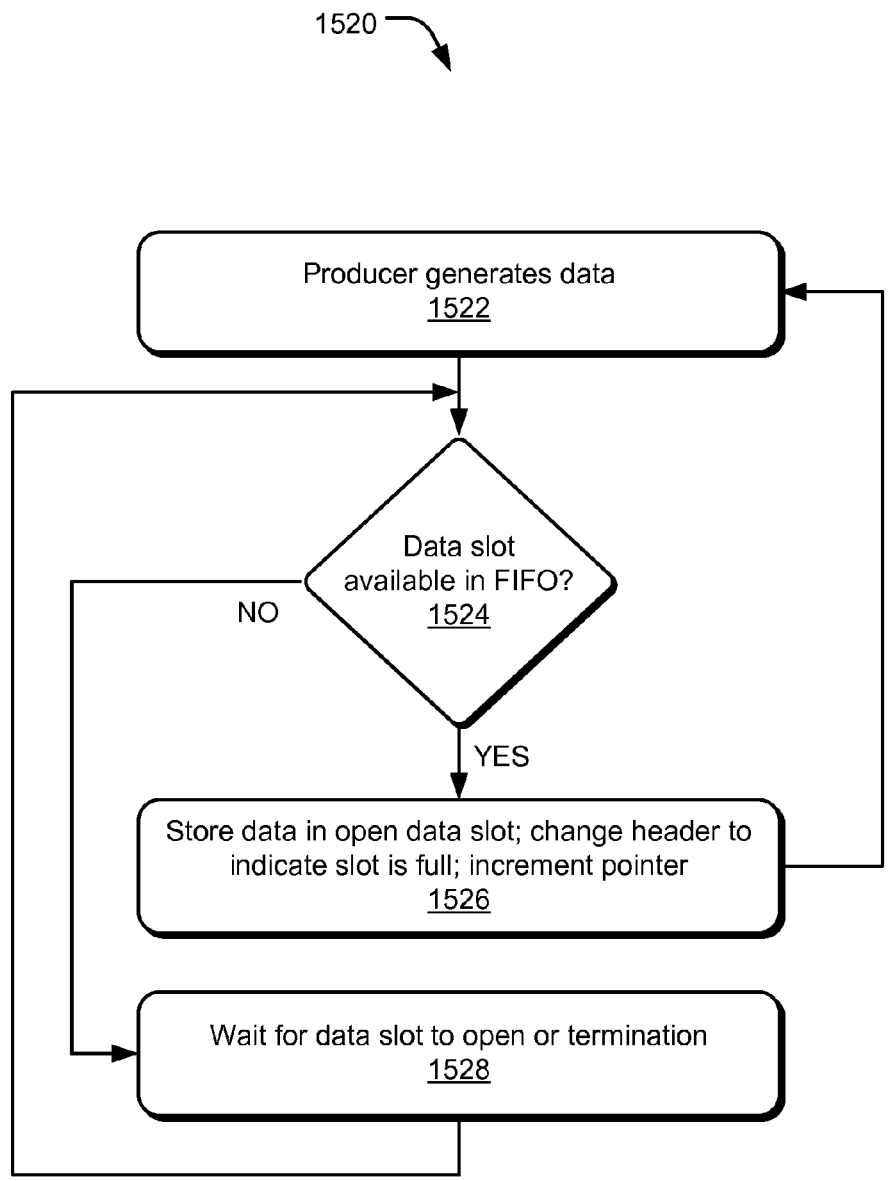
FIG. 15B illustrates a flowchart of an exemplary process of a producer according to some implementations.

FIG. 15B illustrates a flowchart of an exemplary process 1520 carried out by the producer (e.g., first core 1504) for processing digital samples using the synchronized FIFO buffer 1512. The process is executed by the PHY module of the SDR stack using multiple cores of a multi-core processor 1502.

At block 1522, the producer generates data. For example, first core 1504 processes data in functional blocks 1508 (e.g., Block 1 and Block 2) to generate the data.

At block 1524, the producer determines whether an available data slot is open in the FIFO buffer 1512 by referring to the data slot to which the producer pointer 1516 is currently pointing and checking the header for that data slot.

At block 1526, if the header indicates that the current slot is empty the producer stores the generated data in the empty data slot, and increments the producer pointer 1516 by one data slot.

At block 1528, if the header indicates that the data slot to which the producer pointer is currently pointing is full, the producer waits for an empty data slot to become available. A termination condition can also be set by a user when it is desired to stop the process.

Figure 15C:
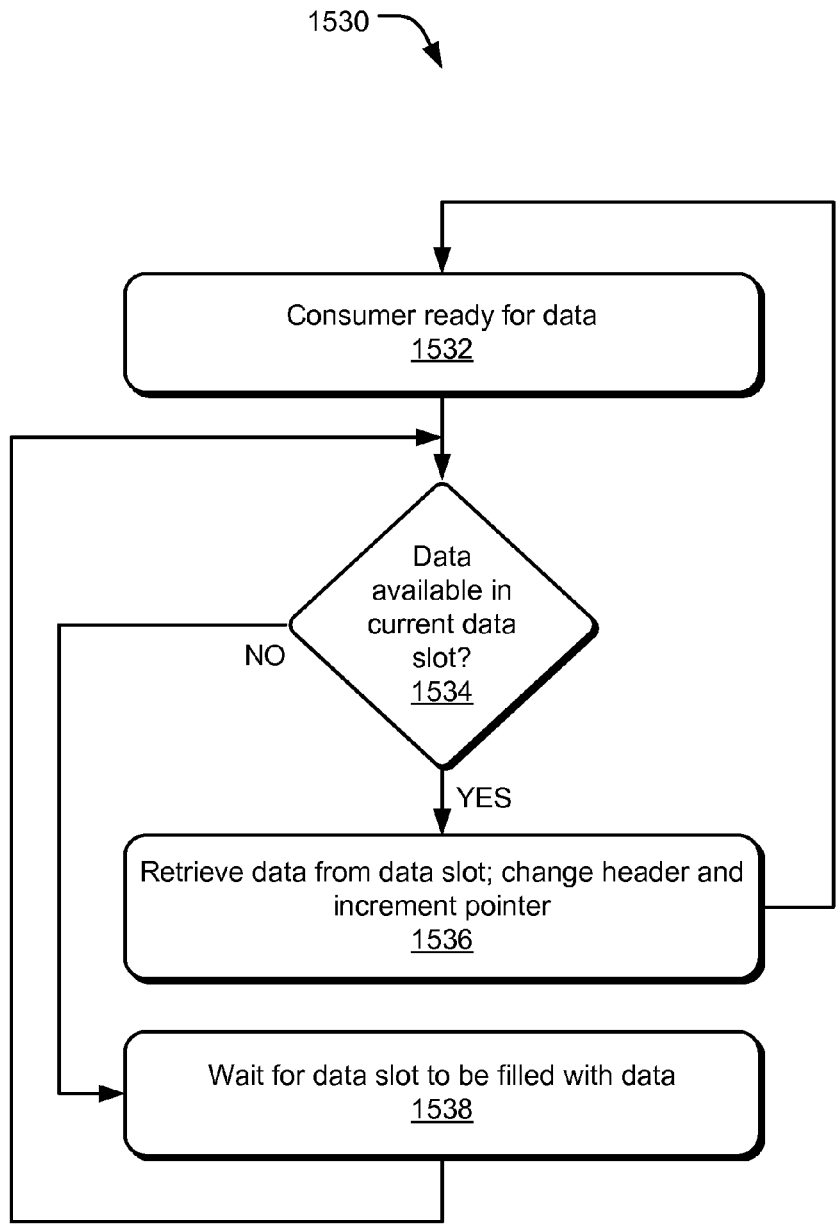
FIG. 15C illustrates a flowchart of an exemplary process of a consumer according to some implementations.

FIG. 15C illustrates a flowchart of an exemplary process 1530 carried out by the consumer (e.g., second core 1506) for processing digital samples using the synchronized FIFO buffer 1512. The process is executed by the PHY module of the SDR stack using multiple cores of a multi-core processor 1502.

At block 1532, the consumer is ready to receive and process data. For example, in the pipeline of Block 3 and Block 4 in second core 1506, data may have been passed from Block 3 to Block 4, and Block 3 is now ready for more data.

At block 1534, the consumer checks the data slot to which the consumer pointer 1518 is currently pointing to determine if the slot contains available data by checking the header to determine whether the header indicates that the slot is full or empty.

At block 1536, when the slot contains data, the consumer takes the data from the data slot, thereby opening the data slot and changing the header of the data slot to indicate that the data slot is now empty. The consumer also increments the consumer pointer to the next data slot.

At block 1538, if no data is available in the current data slot, the consumer continues to check the data slot and waits until the data slot is filled with data.

Real-Time Support

SDR processing is a time-critical task that requires strict guarantees of computational resources and hard real-time deadlines. For example, in the 802.11 protocols, the wireless channel is a resource shared by all transceivers operating on the same spectrum. Thus, because simultaneously transmitting neighbors may interfere with each other, various MAC protocols have been developed to coordinate transmissions in wireless networks to avoid collisions.

Further, most modern MAC protocols, such as 802.11, require timely responses to critical events. For example, 802.11 uses a CSMA (Carrier-Sense Multiple Access) MAC protocol to coordinate transmissions. Transmitters are required to sense the channel before starting their transmission, and channel access is only allowed when no energy is sensed, i.e., the channel is free. The latency between sense and access should be as small as possible. Otherwise, the sensing result could be outdated and inaccurate, resulting in a collision. Another example is the link-layer retransmission mechanisms in wireless protocols, which may require an immediate acknowledgement (ACK) to be returned in a limited time window. Commercial standards like IEEE 802.11 mandate a response latency within tens of microseconds, which is challenging to achieve in software on a general-purpose processor running a general purpose OS.

Thus, as an alternative to relying upon the full generality of real-time operating systems, implementations herein obtain real-time guarantees by dedicating one or more processor cores to SDR processing in a multi-core processing system. Thus, because one or more cores are dedicated to the SDR, implementations herein guarantee sufficient computational resources, without being affected by other concurrent tasks in the system.

For example, wireless communications often require the PHY to constantly monitor the channel for incoming signals. Therefore, the PHY processing may need to be active all the times. It is desirable to schedule this monitoring task to operate continually on the same core to minimize overhead, such as cache misses or TLB flushes. Furthermore, isolating applications into different cores can result in better performance as compared to symmetric scheduling, since an effective use of cache resources and a reduction in locks can outweigh dedicating cores. Moreover, a core dedication mechanism is much easier to implement than a real-time scheduler, sometimes even without modifying an OS kernel. One example of a method for achieving core dedication according to implementations of the SDR herein is raising the priority of a kernel thread so that the kernel thread is pinned on a particular core and runs exclusively on that core until termination.

Implementations of the SDR herein use exclusive threads (i.e., "ethreads") to dedicate cores for real-time SDR tasks. The ethreads can be implemented without any modification to the kernel code. For example, an ethread can be implemented as a kernel-mode thread, and thereby exploit the processor affiliation that is commonly supported in conventional operating systems to provide control regarding on which core the kernel mode thread runs. Once the OS has scheduled the ethread on a specified physical core, the OS raises the priority and/or the IRQL (interrupt request level) on the thread to a level as high as the kernel scheduler, e.g., dispatch level in Windows®. Thus, the ethread takes control of the core and prevents itself from being preempted by other threads by raising the interrupt request level.

Running at such an IRQL, however, does not prevent the core from responding to hardware interrupts. Therefore, the interrupt affiliations of all devices attached to the host are also constrained. For example, if an ethread is running on a particular core, all interrupt handlers for installed devices are removed from the core, thus preventing the core from being interrupted by hardware. Furthermore, to ensure the correct operation of the computing device and operating system, implementations of the SDR herein always ensure core zero is able to respond to all hardware interrupts. Consequently, implementations of the SDR herein only allow ethreads to run on cores whose ID is greater than zero.

Exemplary Implementations

Exemplary implementations of the SDR herein include a fully functional WiFi transceiver on the SDR platform as an exemplary WiFi implementation. The exemplary WiFi implementation SDR stack supports all IEEE 802.11a/b/g modulations and can communicate seamlessly with commercial WiFi network cards. For instance, implementations of high-speed wireless protocols on general-purpose computing device architectures must overcome a number of challenges that stem from existing hardware interfaces and software architectures. First, transferring high-fidelity digital waveform samples into system memory for processing requires very high bus throughput. Conventional software radio platforms use USB 2.0 or Gigabit Ethernet, which cannot satisfy this requirement for sustaining high-speed wireless protocols. Second, physical layer (PHY) signal processing has very high computational requirements for generating information bits from waveforms, and vice versa, particularly at high modulation rates. Lastly, wireless PHY and media access control (MAC) protocols have low-latency real-time deadlines that must be met for correct operation. For example, the 802.11 MAC protocol requires precise timing control and ACK response latency on the order of tens of microseconds. Existing software architectures on the general-purpose computing devices cannot consistently meet this timing requirement.

Figure 16A:
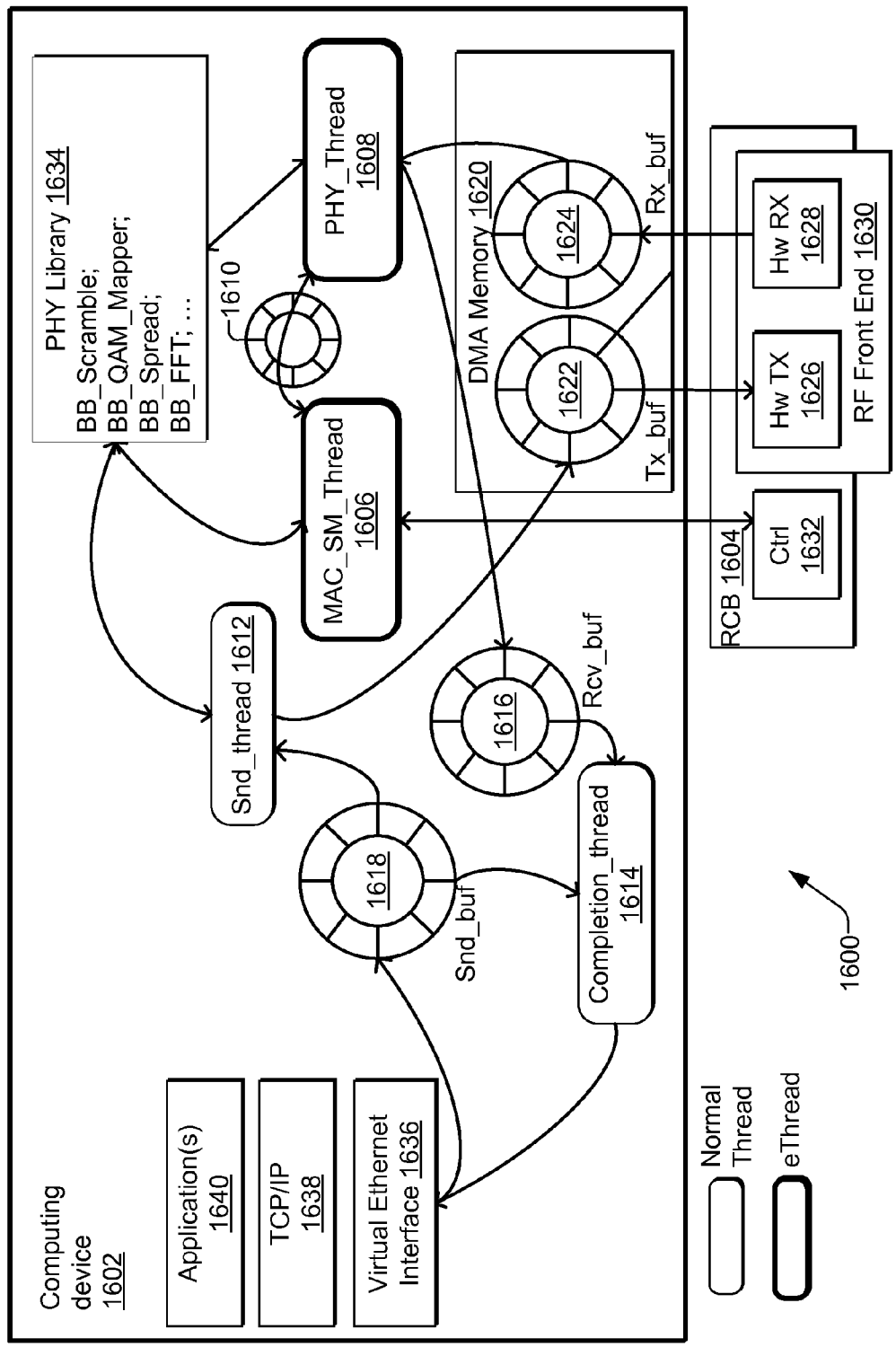
FIG. 16A illustrates an example of an SDR according to some implementations.

FIG. 16A illustrates an exemplary WiFi implementation 1600 of the SDR herein implemented on hardware, such as a computing device 1602, having a multi-core processor as described above with reference to FIGS. 1 and 2, and coupled to an RCB 1604 corresponding to RCBs 116, 214, and/or 302. In the illustrated implementation, the MAC state machine (SM) is implemented as an ethread 1606 by raising the priority of a kernel thread so that the kernel thread is pinned on a particular core and runs exclusively on that core until termination. Since a radio according to the 802.11 standard is a half-duplex radio, the demodulation components of the PHY can run directly within a MAC SM thread. Furthermore, if a single core is insufficient for all PHY processing (e.g., as may be the case with 802.11a/g), the PHY processing can be partitioned across two ethreads comprising MAC_SM thread 1606 and a PHY_Thread 1608. These two ethreads 1606, 1608 are streamlined using a synchronized CPFIFO 1610, as discussed above with respect to FIGS. 15A-8C. An additional thread, Snd_thread 1612, modulates the outgoing frames into waveform samples in the background. As discussed above, these modulated waveforms can be pre-stored in the RCB's memory to facilitate speedy transmission. Further, a Completion_thread 1614 monitors a receive buffer, Rcv_buf 1616 and notifies upper software layers of any correctly received frames. The completion thread 1614 also cleans up Rcv_buf 1616 and a send buffer, Snd_buf 1618 after they are used. Because the functions of the Completion_thread 1614 and the Snd_thread 1612 do not require the same high performance and low latency of the PHY ethreads 1606, 1608, these other threads are not implemented as ethreads, and can be run on any available core.

In the illustrated example, DMA memory 1620 includes a transmitter buffer TX_buf 1622 and a receiver buffer RX_buf 1624 for storing digital samples for transmission and reception on transmitter hardware 1626 and receiver hardware 1628, respectively, on the RF front end 1630 as discussed above, such as with respect to FIG. 4. Furthermore, RCB 1604 includes control modules 1632, such as the DMA controller, bus controller, memory controller, and RF controller described above with respect to FIG. 4, and collectively represented as Ctrl 1624, which exchange commands with MAC_SM_Thread 1606 for ensuring proper interaction between RCB 1604 and computing device 1602. During streamline processing, MAC_SM thread 1606 and PHY thread 1608 access the PHY library 1634 for accessing LUTs and SIMD instructions for carrying out optimized PHY processing, as discussed above with respect to FIGS. 6A-6C and 7A-7B. The processed digital samples are delivered to the receive buffer 1616, are then presented via the completion thread 1614 to virtual Ethernet interface 1636, thereby to the TCP/IP layer 1638, and thus, to one or more applications 1640 also running on one or more cores of computing device 1602.

Figure 16B:
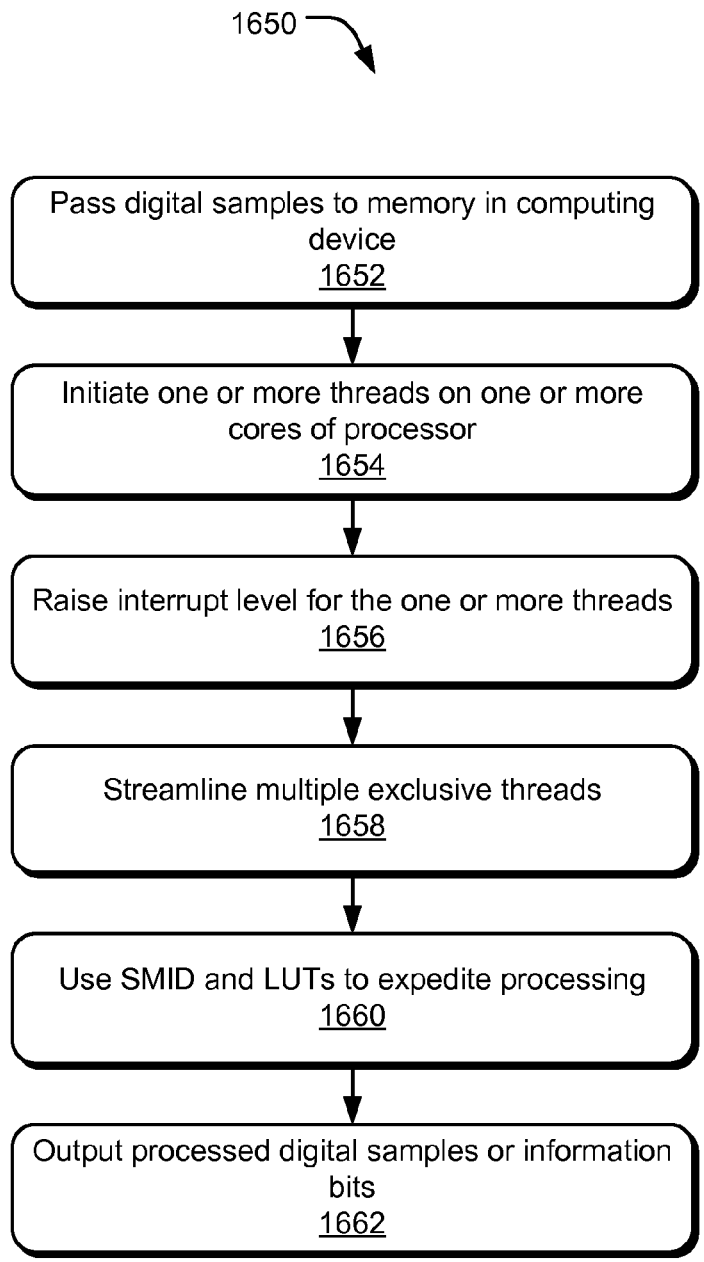
FIG. 16B illustrates an exemplary process for exclusively performing SDR processing on the one or more cores.

FIG. 16B illustrates an exemplary process 1650 that may be executed using one or more cores of a multi-core processor for exclusively performing SDR processing on the one or more cores.

At block 1652, digital samples are passed from the RCB to the memory in the computing device. The digital samples are received from the RF front end by the RCB and then may be passed to the memory in the computing device using direct memory access (DMA), or the like. The passing of the digital samples to the memory in the computing device may be controlled by a DMA controller on the RCB, and the DMA may also temporarily store the digital samples on the RCB in a buffer or onboard memory.

At block 1654, threads may be initiated on one or more cores of the multi-core processor for performing SDR processing, such as PHY and MAC processing.

At block 1656, the interrupt request level for the one or more cores may be raised to ensure that the threads are not interrupted so that the cores are able to exclusively perform SDR processing of the digital samples. Further, the interrupt handler for the one or more cores may also be removed to prevent hardware interrupts as well.

At block 1658, when multiple threads operate on different cores, the processing between cores may be streamlined as discussed above using a synchronized FIFO between the cores.

At block 1660, SMID and LUTs may be used where applicable to expedite the SDR processing of the digital samples.

At block 1662, the processed digital samples are output for use, such as by an application on the computing device. Further, while the foregoing process illustrates exclusive core processing of digital samples received from the RF front end, it may be seen that digital samples generated by the computing device for transmission by the RF front end are similarly processed. For example, in the case of digital samples to be transmitted, steps 1654-1660 are the same, with the input being a bit stream generated or received by the computing device, such as from an application, and the output being processed digital samples ready for conversion to analog and transmission by the RF front end.

Figure 17:
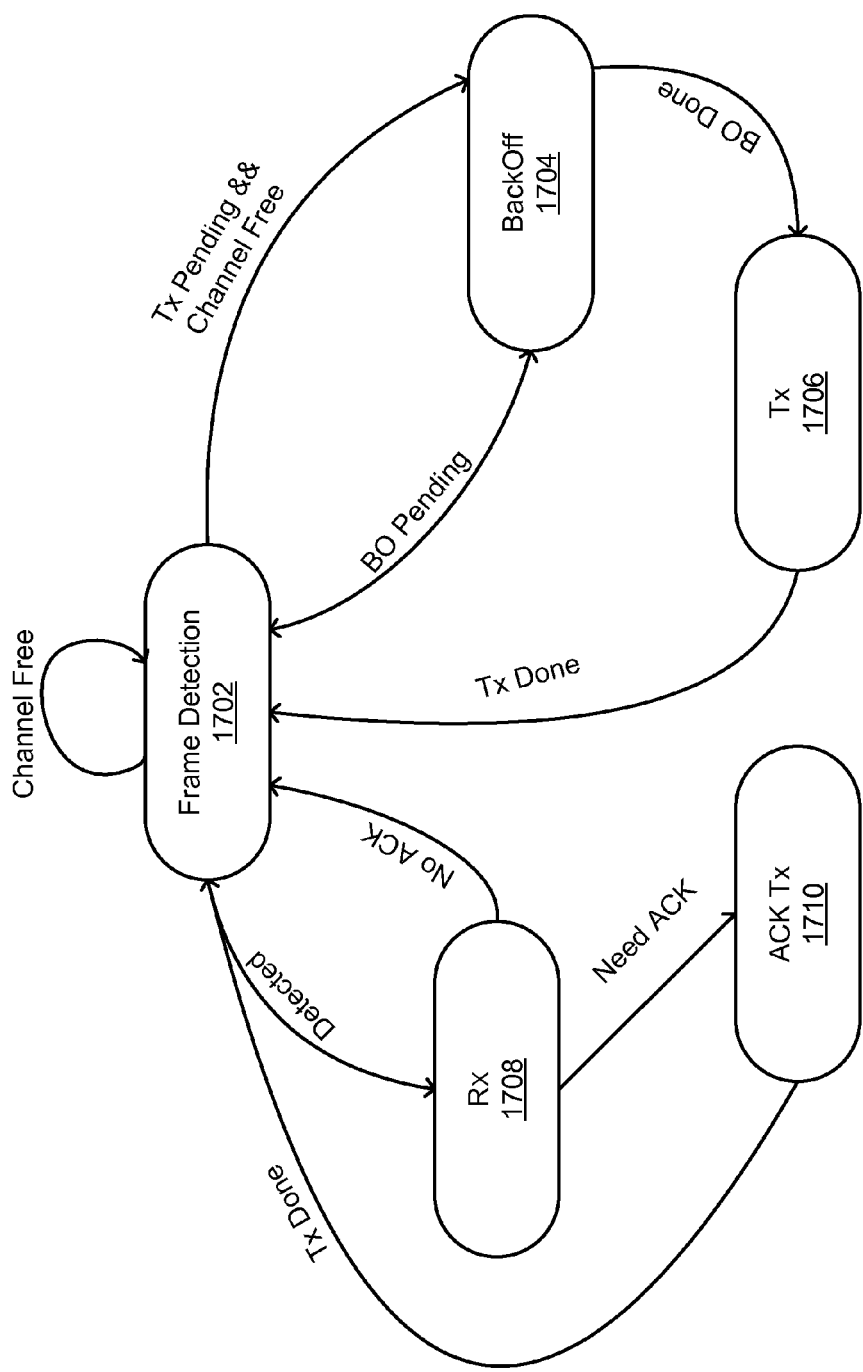
FIG. 17 illustrates exemplary MAC processing according to some implementations.

Further, the exemplary WiFi implementation 1600 is able to implement the basic access mode of the 802.11 standard. Exemplary details of the MAC State Machine are illustrated in FIG. 17. Normally, the SM is in the Frame Detection (FD) state 1702. In the frame detection state 1702, the RCB 1604 constantly writes samples into the Rx_buf 1624. The SM (i.e. MAC_SM_Thread 1606) continuously measures the average energy to determine whether the channel is clean or whether there is an incoming frame.

The transmission of a frame follows the carrier-sense multiple access (CSMA) mechanism. When there is a pending frame to be transmitted, the SM first checks whether the energy on the channel is low (i.e., no frame is currently being received). If the channel is busy, the transmission is deferred and a backoff timer 1704 is started. Each time the channel becomes free, the SM checks if any backoff time remains. If the timer goes to zero, the SM transmits the pending frame at block Tx 1706.

Further, when the exemplary WiFi implementation starts to receive a frame, it detects a high energy in the frame detection state 1702. In 802.11, SM uses three steps in the PHY layer to receive a frame at block Rx 1708. First, the PHY layer needs to synchronize to the frame, i.e., find the starting point of the frame (timing synchronization) and the frequency offset and phase of the sample stream (carrier synchronization). Synchronization is usually done by correlating the incoming samples with a pre-defined preamble. Subsequently, the PHY layer needs to demodulate the PLCP (Physical Layer Convergence Protocol) header, which is always transmitted using a fixed low-rate modulation mode. The PLCP header contains the length of the frame as well as the modulation mode, possibly a higher rate, of the frame data that follows. Thus, only after successful reception of the PLCP header will the PHY layer know how to demodulate the remainder of the frame.

After successfully receiving a frame at Rx 1708, the 802.11 MAC standard requires a receiving station to transmit an ACK frame in a timely manner as indicated at block ACK Tx 1710. For example, 802.11b requires that an ACK frame be sent with no more than a 10 μs delay to acknowledge receipt of the received frame. However, this short ACK requirement is quite difficult for an SDR implementation to achieve in software on a general-purpose computing device. Both generating and transferring the waveform across the system bus can cause a latency of several microseconds, and total time required is usually larger than the maximum amount mandated by the standard. Fortunately, an ACK frame generally has a fixed pattern. For example, in 802.11 all data in an ACK frame is fixed except for the sender address of the corresponding data frame. Thus, in the exemplary WiFi implementation 1600, it is possible to pre-calculate most of an ACK frame (19 bytes), and update only the address (10 bytes). Further, this can be done early in the processing, immediately after demodulating the MAC header, and without waiting for the end of a frame. The waveform is then pre-stored into the memory of the RCB. Thus, the time for ACK generation and transferring can overlap with the demodulation of the data frame being received. After the MAC SM demodulates the entire frame and validates the CRC32 checksum, the MAC SM instructs the RCB to transmit the ACK, which has already been stored on the RCB. Thus, the latency for ACK transmission is very small because the ACK is already stored in the RCB and can be immediately transmitted without having to be generated or sent along the system bus.

In rare cases when the incoming data frame is quite small (e.g., the frame contains only a MAC header and zero payload), then the exemplary WiFi implementation cannot fully overlap ACK generation and the DMA transfer with demodulation to completely hide the latency. In this case, the exemplary WiFi implementation may fail to send the ACK in time. This problem is addressed by maintaining a cache of previous ACKs in the RCB. With 802.11, all data frames from one node will have exactly the same ACK frame. Thus, pre-allocated memory slots in the RCB can be used to store ACK waveforms for different senders (in some implementations, 64 different slots are allocated). Therefore, when demodulating a frame, if the ACK frame is already in the RCB cache, the MAC SM simply instructs the RCB to transmit the pre-cached ACK. With this scheme, the exemplary WiFi implementation may be late on the first small frame from a sender, effectively dropping the packet from the sender's perspective. But the retransmission, and all subsequent transmissions, will find the appropriate ACK waveform already stored in the RCB cache.

The exemplary WiFi implementation 1600 has been implemented and tested as a full 802.11a/g/b transceiver, which support DSSS (Direct Sequence Spreading: 1 and 2 Mbps in 11b), CCK (Complementary Code Keying: 5.5 and 11 Mbps in 11b), and OFDM (Orthogonal Frequency Division Multiplexing: 6, 9 and up to 54 Mbps in 802.11a/g).

Accordingly, implementations of the SDR herein have been found to interoperate seamlessly with commercial hardware-based 802.11 devices, while supporting the full suite of 802.11a/b/g modulation rates and achieving substantially equivalent performance to the hardware-based devices at each modulation. As a result, it may be seen that implementations of the SDR herein can process signals sufficiently fast to achieve full channel utilization, and that the SDR can satisfy all timing requirements of the 802.11 standards with a software implementation on a general-purpose computing device.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as networked communication devices, computing devices, and other electronic devices.

What is claimed is:
1. A method implemented on a computing device—in a software defined radio (SDR) system—by a processor configured to execute instructions that, when executed by the processor, direct the computing to device to perform acts comprising:
  receiving an array of data bits;
  loading a set of bits of the array of data bits;
  performing a "min" operation to find an optimal path in a Trellis diagram of a Viterbi decoder, wherein the "min" operation includes:

starting from a known state in the Trellis diagram; and updating a data structure for each expansion in the Trellis diagram relative to the known state, the data structure containing a path metric embedded in most significant bits to define a minimal value for each state in the expansion, and a path index embedded in least significant bits to define link information for the minimal value; and tracing back the minimal values relative to an end state of the Trellis diagram to obtain the optimal path.

2. The method of claim 1, wherein the array of data bits includes one or more soft values from a soft demapper in the SDR system.

3. The method of claim 2, wherein the soft demapper further comprises:

receiving a sequence of data;

quantizing the sequence of data into in-phase (I) component and quadrature phase (Q) component, wherein the I component and the Q component are combined to form an I-Q pair input;

using the I-Q pair input in a look-up table (LUT) that provides the one or more soft values for the I component and the Q component, wherein the LUT is shared and used by the I component and the Q component, which are computed separately; and outputting the one or more soft values for the I-Q pair input.

4. The method of claim 1, wherein the SDR system further includes a finite impulse response (FIR) filter, which comprises:

receiving an array of input samples, wherein the array of input samples includes an in-phase (I) sample and a quadrature phase (Q) sample, wherein the coefficient arrays include a first coefficient array for the I sample and a second coefficient array for the Q sample;

loading the I sample and the Q sample;

multiplying the I sample with the first coefficient array to provide a first product, multiplying the Q sample with the second coefficient array to provide a second product, wherein the first product and the second product are stored in a temporal accumulative sum, wherein the temporal accumulative sum includes a summation of the first product for the I sample and summation of the second product for the Q sample; and outputting the temporal accumulative sum for the I sample and the Q sample; and wherein the FIR filter includes a memory layout that contains:

one or more rows forming a packed-vector of "m" components for single input multiple data (SIMD) operations;

a coefficient vector that is replicated in each of "m" columns in a zigzag layout; and an "n" temporary variables containing accumulated sum for each FIR filter tap for the I sample and the Q sample;

wherein a total number of the one or more rows is equivalent to a value of—"n" plus "m" minus one—the "m" and "n" are integers, and wherein the SIMD operations are used to accelerate processing in the FIR filter.

5. The method of claim 1, wherein the array of data bits are encoded using at least one of convolutional encoder or turbo encoder, the convolutional encoder and the turbo encoder each uses a look-up table (LUT) to reduce computational requirements for online processing and to speed up overall processing time.

6. The method of claim 5, wherein the LUT includes an input index that combines input bits with present bit-states in the convolutional encoder or the turbo encoder.

7. The method of claim 5, wherein the LUT includes an output that contains new bit-states and output bits, wherein the new bit-states are used to update the present bit-states.

8. The method of claim 1, wherein the "min" operation is implemented by at least one or more multi-core processors that execute single input multiple data (SIMD) instructions.

9. The method of claim 1, wherein the data structure is used during the trace back by tracing stored path index for each expansion.

10. The method of claim 1, wherein the embedding of the path index in the least significant bits of the data structure does not affect an output of the "min" operation.

11. A computer-readable storage device having computer-readable instructions thereon which, when executed by a computer in a software defined radio (SDR) system, implement a method comprising:

receiving an array of data bits;

loading a byte of the array of data bits;

performing an algorithm to find an optimal path in a Trellis diagram, wherein the algorithm includes:

starting from a known state in the Trellis diagram; and updating a data structure for each expansion in the Trellis diagram relative to the known state, the data structure containing a path metric embedded in most significant bits to define a minimal value for each state in the expansion, and a path index embedded in least significant bits to define link information for the minimal value; and tracing back the minimal values relative to an end state of the Trellis diagram, wherein the tracing back uses single input multiple data (SIMD) instructions to accelerate processing.

12. The computer-readable storage device of claim 11, wherein the array of data bits includes data bits that were transmitted using spreading modulation.

13. The computer-readable storage device of claim 12, wherein the spreading modulation uses a look-up table (LUT) as an optimization method, the LUT is used to map information bits directly to spread signal sequence.

14. The computer-readable storage device of claim 11, wherein the Trellis diagram is used in different algorithms employed in the SDR system.

15. The computer-readable storage device of claim 11, wherein the SDR system further comprises a finite impulse response (FIR) filter, which includes a memory layout that contains:

one or more rows forming a packed-vector of "m" components for single input multiple data (SIMD) operations;

a coefficient vector that is replicated in each of "m" columns in a zigzag layout; and an "n" temporary variables containing accumulated sum for each FIR filter tap for in-phase (I) sample and quadrature phase (Q) sample;

wherein a total number for the one or more rows is equivalent to a value of—"n" plus "m" minus one—the "m" and "n" are integers, and wherein the SIMD operations are used to accelerate processing in the FIR filter.

16. The computer-readable storage device of claim 11, wherein SDR system further comprises at least one of:

a scrambler or a de-scrambler that use a look-up table (LUT) as an optimization method, wherein the LUT is constructed by combining input bits with present bit-states as an input index; and an output for the LUT includes output bits and new bit-states.

17. The computer-readable storage device of claim 16, wherein the present bit-states are updated using the new-bit states.

18. A software-defined radio (SDR) stack comprising:
a memory; and
a multi-core processor coupled to the memory, which is configured to:
   receive an array of data bits comprising one or more soft values from a soft-demapper that uses a look-up table (LUT) as an optimization method;
   load a byte of the array of data bits;
   perform an algorithm to find an optimal path in a Trellis diagram, wherein the algorithm includes:
      starting from a known state in the Trellis diagram; and
      updating a data structure for each expansion in the Trellis diagram relative to the known state, the data structure containing a path metric and a path index; and
   trace back the optimal path relative to an end state of the Trellis diagram.

19. The SDR stack of claim 18, wherein the LUT is shared and used by in-phase (I) component and quadrature phase (Q) component, which are computed separately.

20. The SDR stack of claim 19, wherein the LUT includes an input of I-Q pair that is derived from a quantized received symbol, the quantized received symbol includes the I component and the Q component that are combined to provide the I-Q pair.

* * * * *